United States Patent
Matsumura

(10) Patent No.: US 12,211,866 B2
(45) Date of Patent: Jan. 28, 2025

(54) IMAGING DEVICE

(71) Applicant: SONY SEMICONDUCTOR SOLUTIONS CORPORATION, Kanagawa (JP)

(72) Inventor: Yusuke Matsumura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 302 days.

(21) Appl. No.: 17/636,427

(22) PCT Filed: Apr. 23, 2020

(86) PCT No.: PCT/JP2020/017535
§ 371 (c)(1),
(2) Date: Feb. 18, 2022

(87) PCT Pub. No.: WO2021/044667
PCT Pub. Date: Mar. 11, 2021

(65) Prior Publication Data
US 2022/0278153 A1    Sep. 1, 2022

(30) Foreign Application Priority Data
Sep. 3, 2019 (JP) ................................ 2019-160598

(51) Int. Cl.
*H01L 27/14*   (2006.01)
*H01L 27/146*  (2006.01)
*H01L 31/00*   (2006.01)

(52) U.S. Cl.
CPC .. *H01L 27/14623* (2013.01); *H01L 27/14603* (2013.01); *H01L 27/1464* (2013.01); *H01L 27/14643* (2013.01)

(58) Field of Classification Search
CPC ......... H01L 27/14623; H01L 27/14603; H01L 27/1464; H01L 27/14643; H01L 27/14614; H01L 27/14612; H04N 9/00; H04N 25/77
(Continued)

(56) References Cited

U.S. PATENT DOCUMENTS

2015/0035028 A1   2/2015   Fan et al.
2015/0129943 A1   5/2015   Kato et al.
(Continued)

FOREIGN PATENT DOCUMENTS

JP   2013-098446    5/2013
JP   2015095468 A   5/2015
(Continued)

OTHER PUBLICATIONS

International Search Report prepared by the European Patent Office on Jun. 29, 2020, for International Application No. PCT/JP2020/017535, 3 pgs.
(Continued)

*Primary Examiner* — Theresa T Doan
(74) *Attorney, Agent, or Firm* — SHERIDAN ROSS P.C.

(57) ABSTRACT

An imaging device according to an embodiment of the present disclosure includes a photoelectric conversion section provided in a semiconductor substrate, a charge holding section that is provided as being laminated over the photoelectric conversion section in a thickness direction of the semiconductor substrate and holds a charge photoelectrically converted by the photoelectric conversion section, a horizontal light shielding film that is provided between the photoelectric conversion section and the charge holding section and extends in an in-plane direction of the semiconductor substrate, and a plurality of vertical gate electrodes that passes through an identical opening provided in the
(Continued)

horizontal light shielding film and extends to the photoelectric conversion section in the thickness direction of the semiconductor substrate.

20 Claims, 15 Drawing Sheets

(58) Field of Classification Search
USPC .......................................................... 257/431
See application file for complete search history.

(56) References Cited

U.S. PATENT DOCUMENTS

| | | |
|---|---|---|
| 2016/0126266 A1 | 5/2016 | Kato et al. |
| 2016/0343756 A1 | 11/2016 | Fan et al. |
| 2017/0077155 A1 | 3/2017 | Sano et al. |
| 2017/0250210 A1 | 8/2017 | Kato et al. |
| 2017/0373106 A1 | 12/2017 | Li |
| 2018/0033809 A1* | 2/2018 | Tayanaka ............... H04N 25/60 |
| 2018/0145101 A1 | 5/2018 | Sano et al. |
| 2018/0261635 A1 | 9/2018 | Kato et al. |
| 2019/0252447 A1 | 8/2019 | Toda |
| 2019/0348450 A1 | 11/2019 | Kato et al. |
| 2020/0083262 A1 | 3/2020 | Tayanaka et al. |

FOREIGN PATENT DOCUMENTS

| | | |
|---|---|---|
| JP | 2016103541 A | 6/2016 |
| JP | 2016534557 A | 11/2016 |
| JP | 2018147975 A | 9/2018 |
| JP | 2018148039 A | 9/2018 |
| WO | WO-2016136486 A1 | 9/2016 |
| WO | WO-2019131965 A1 | 7/2019 |

OTHER PUBLICATIONS

Written Opinion prepared by the European Patent Office on Jun. 29, 2020, for International Application No. PCT/JP2020/017535, 6 pgs.

* cited by examiner

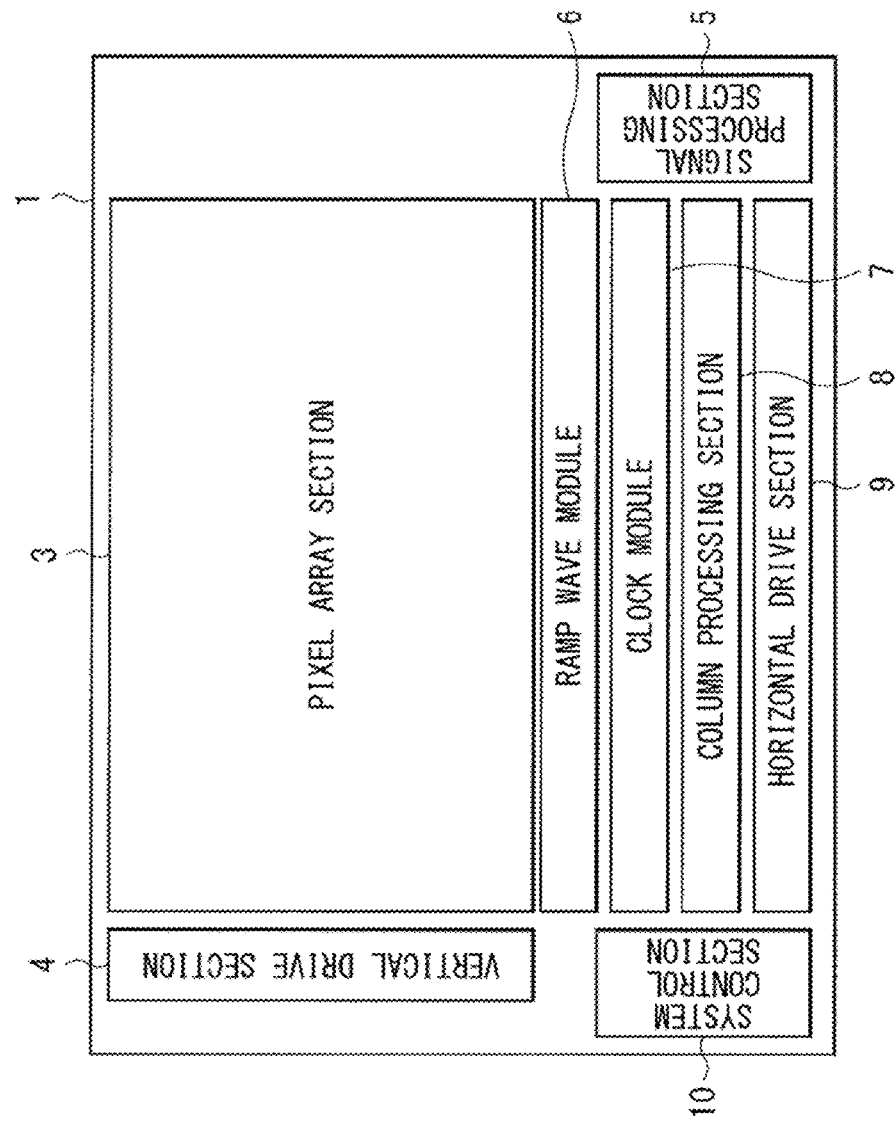
[Fig. 1]

[Fig. 2]
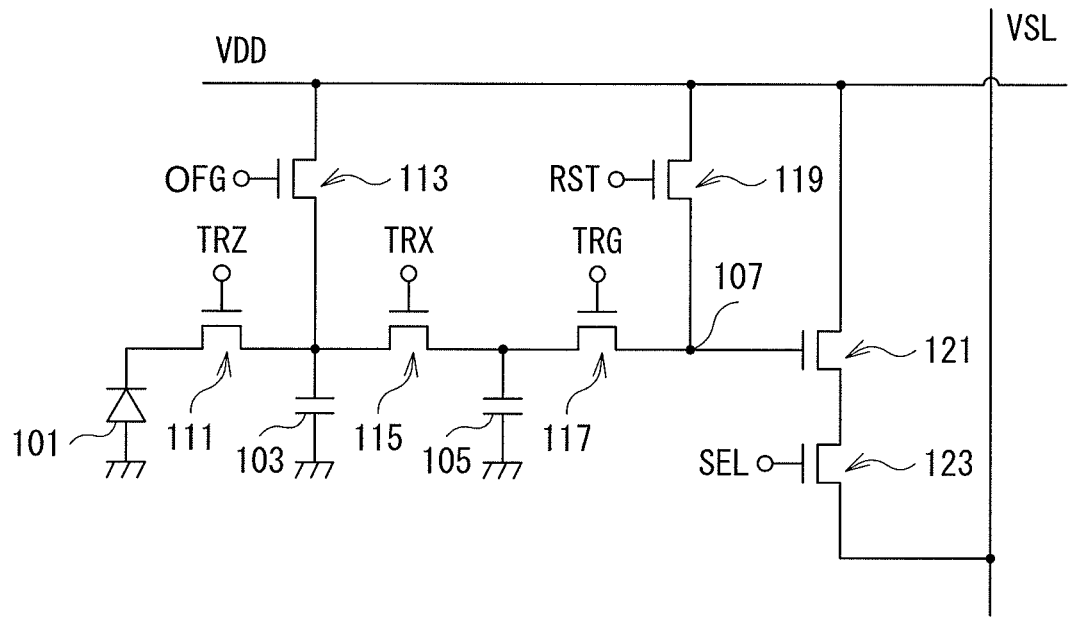
[Fig. 3]
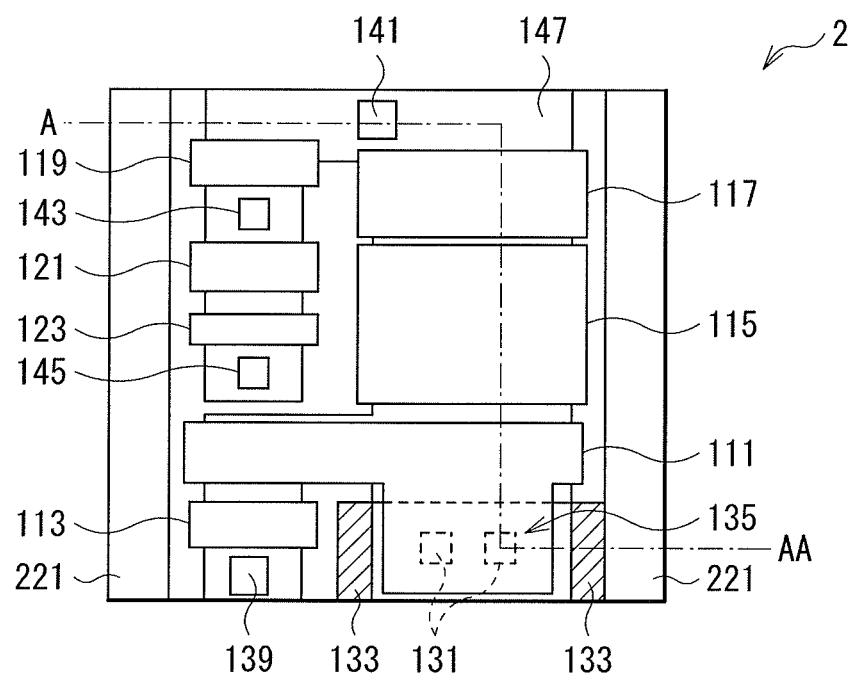

[Fig. 4]
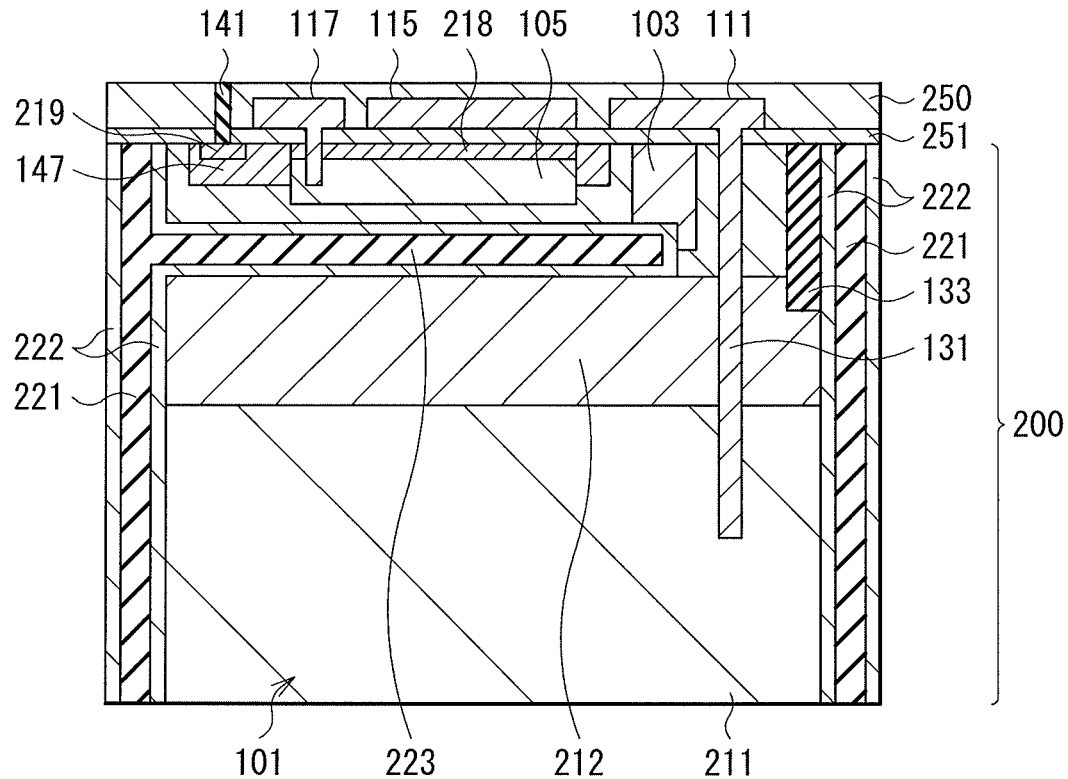
[Fig. 5]
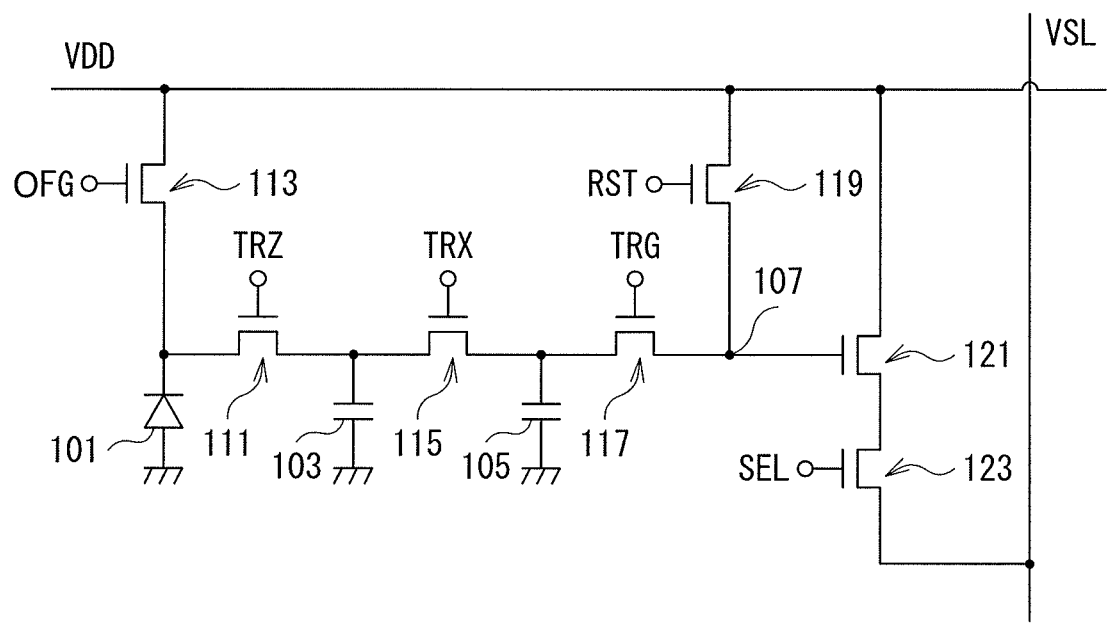

[Fig. 6]
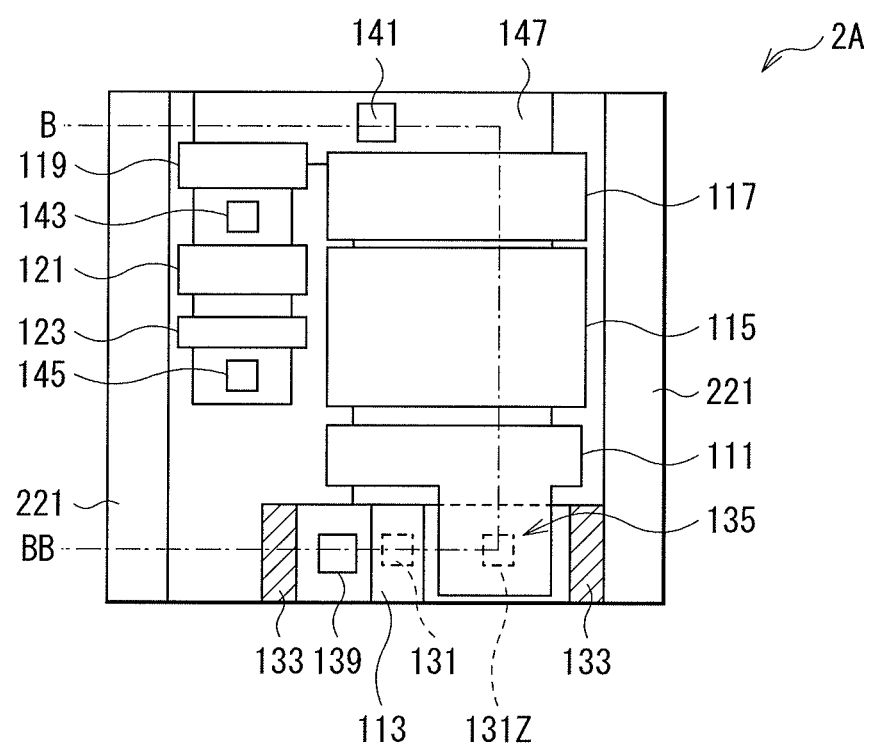

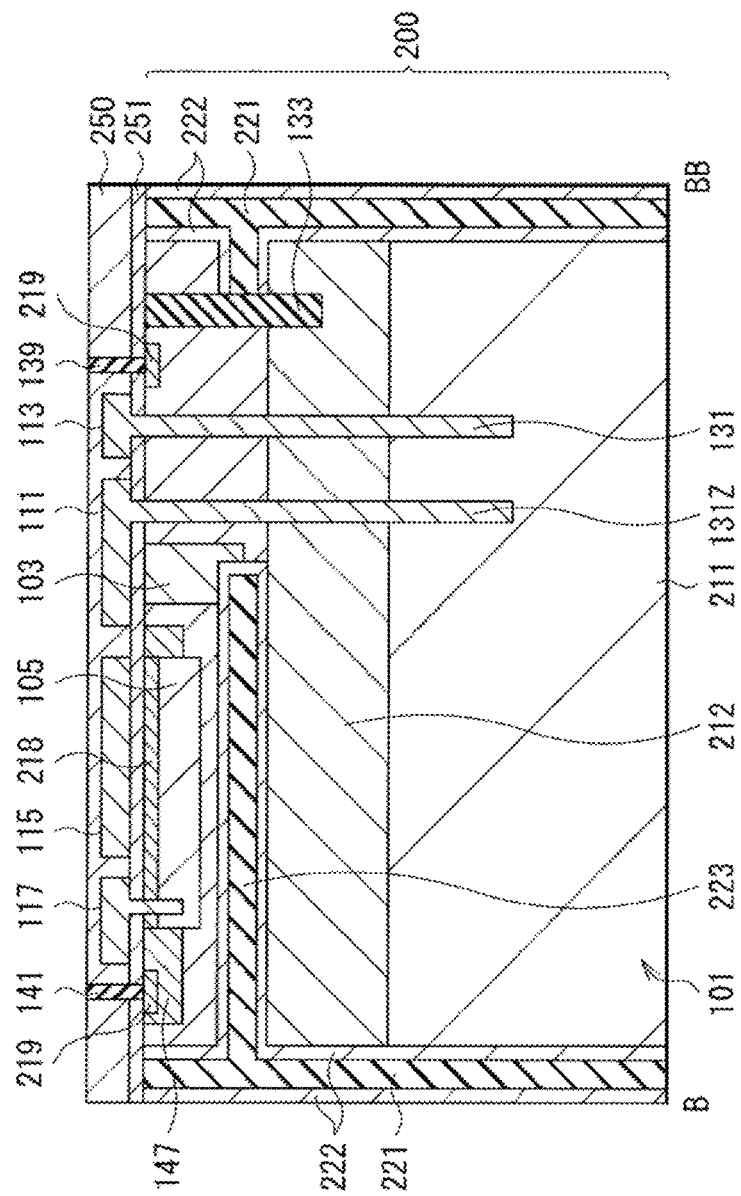
[Fig. 7]

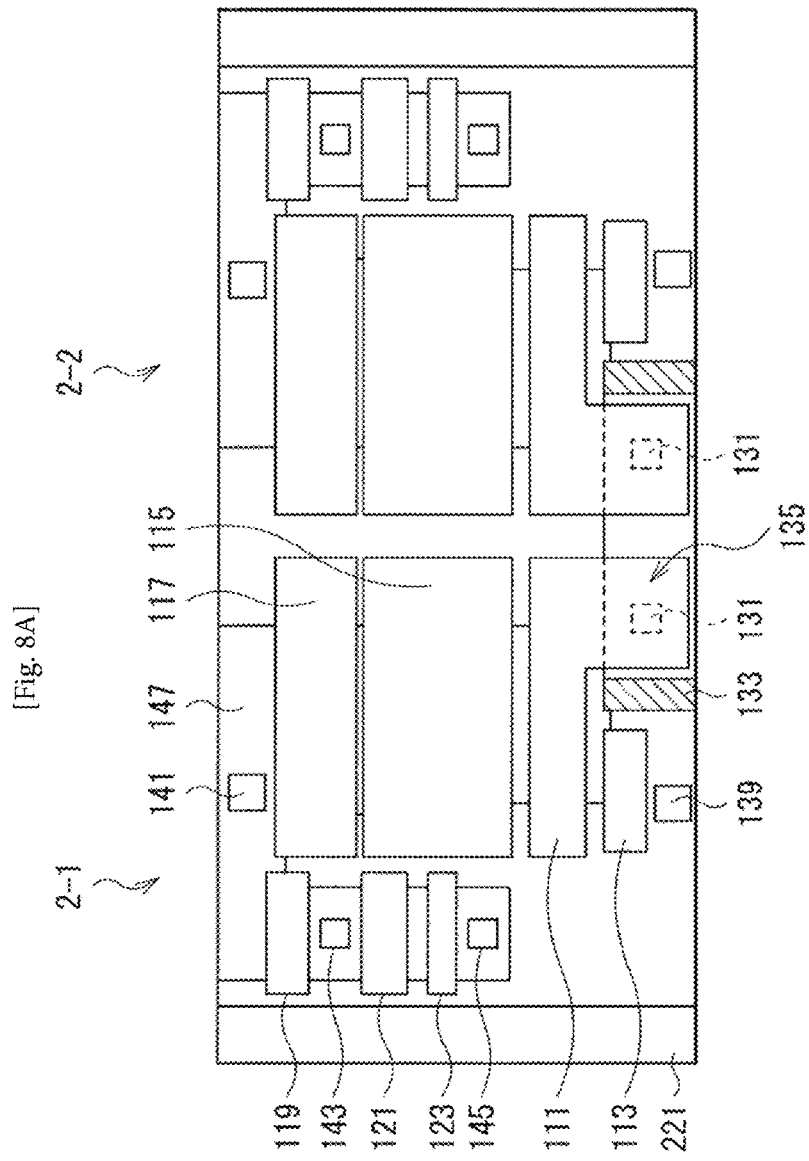

[Fig. 8B]
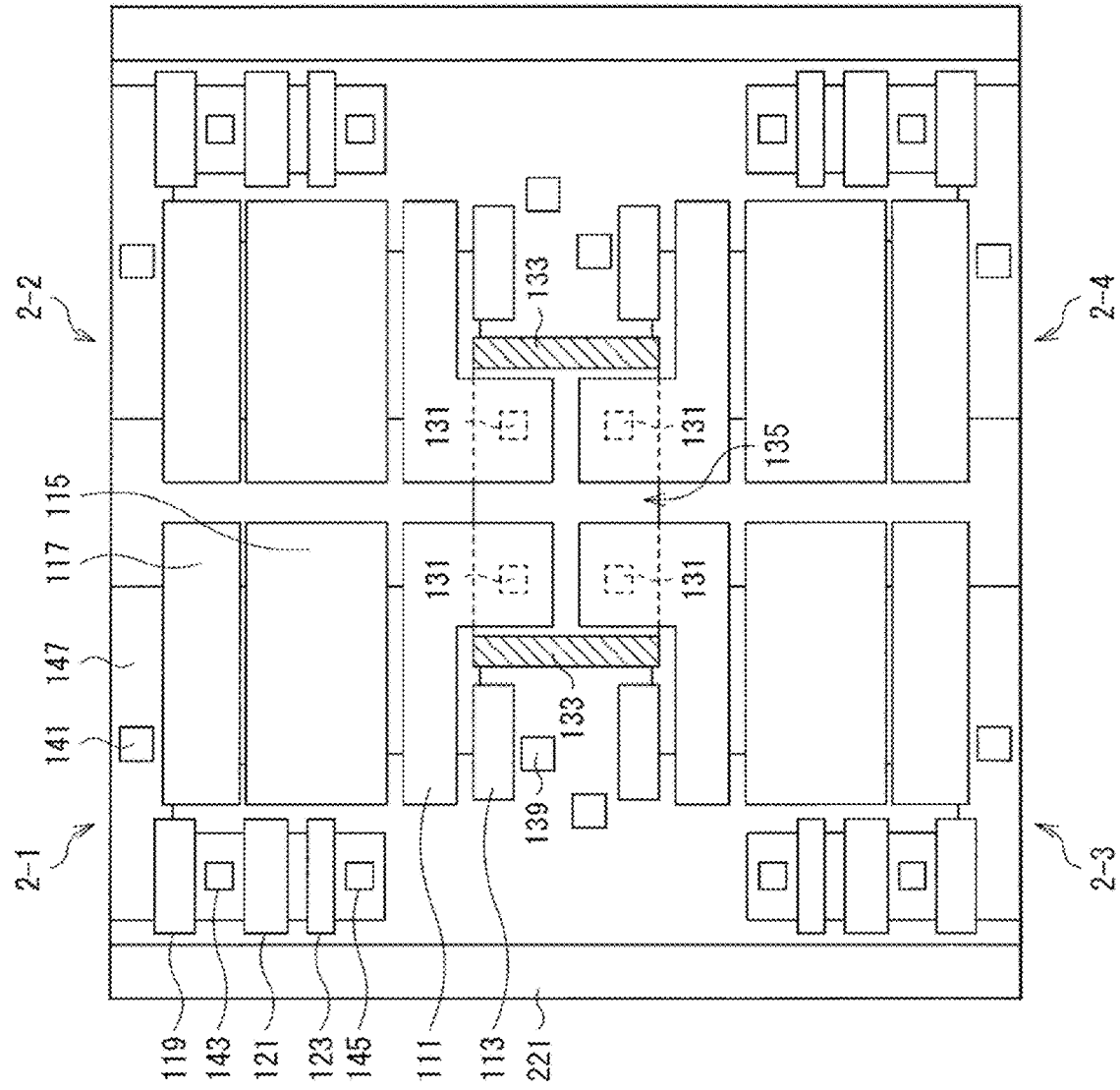

[Fig. 9]
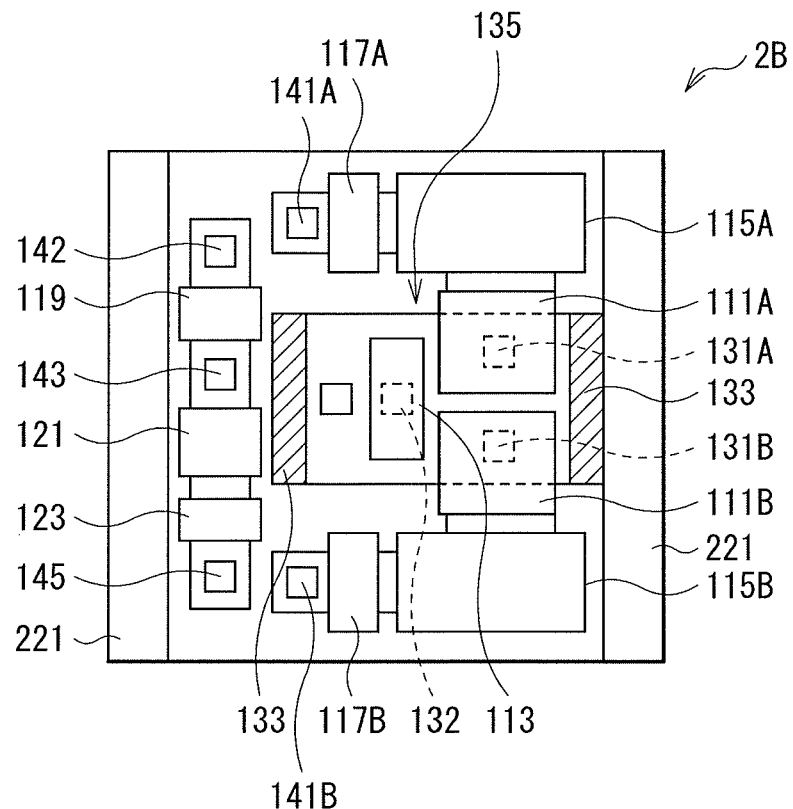
[Fig. 10]
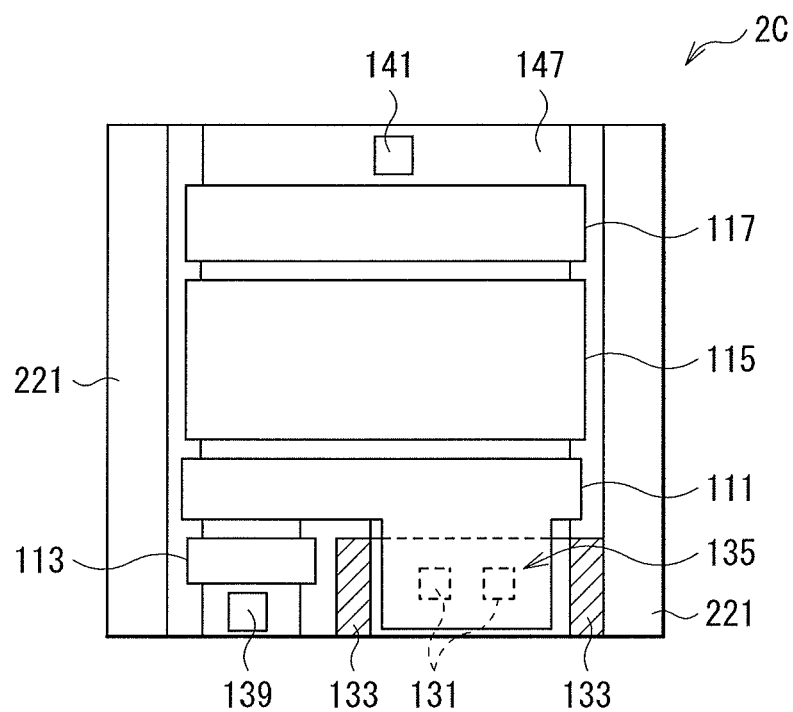

[Fig. 11]
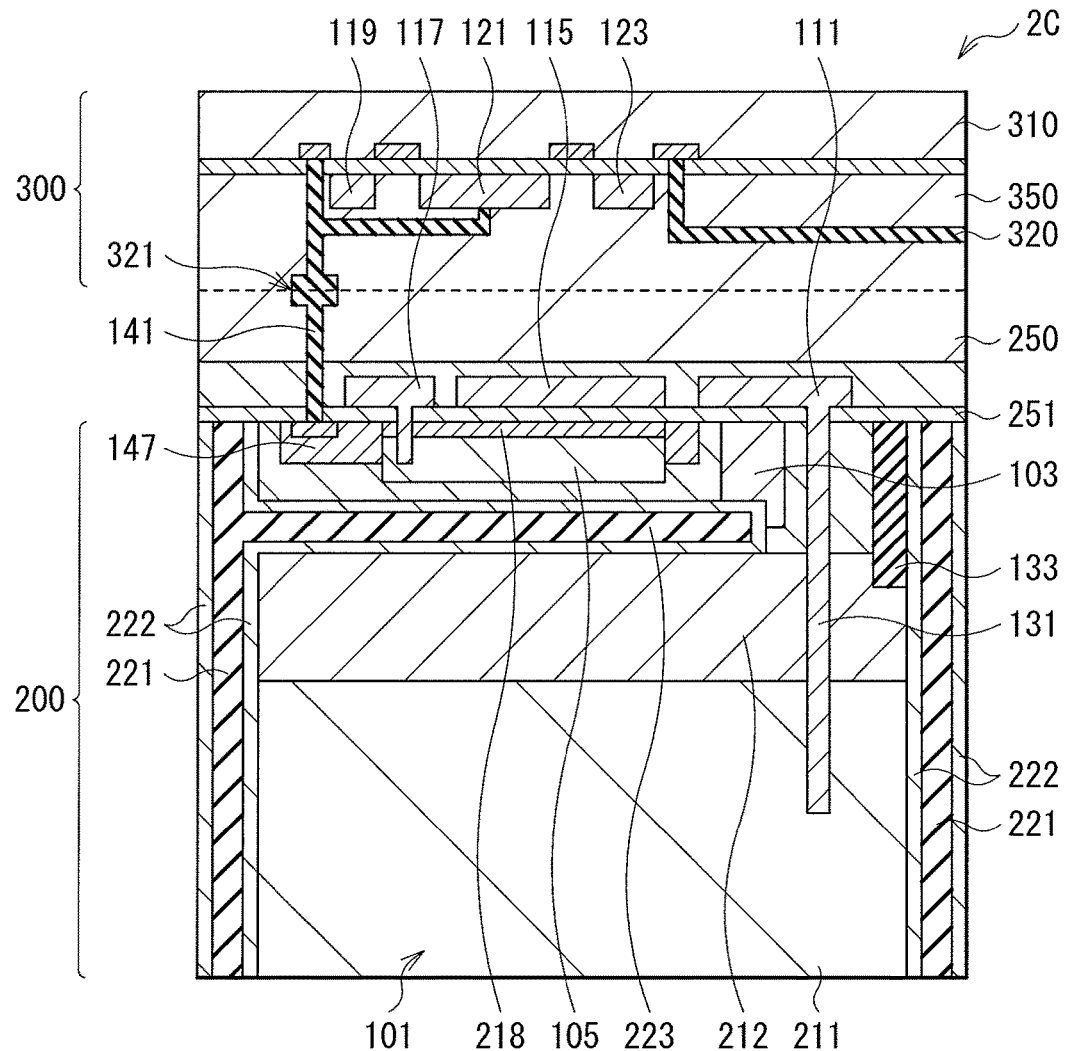
[Fig. 12]
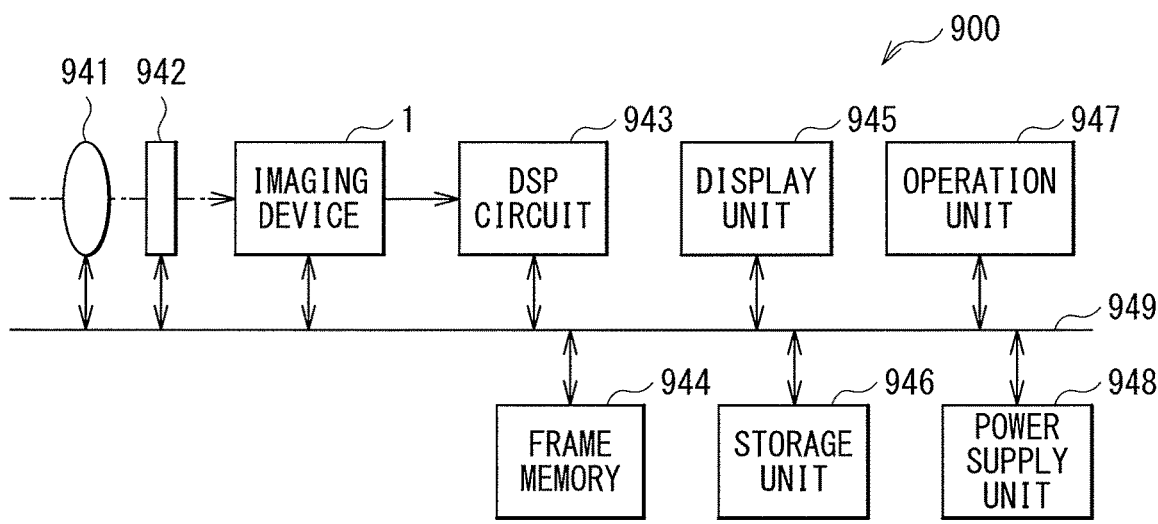

[Fig. 13]
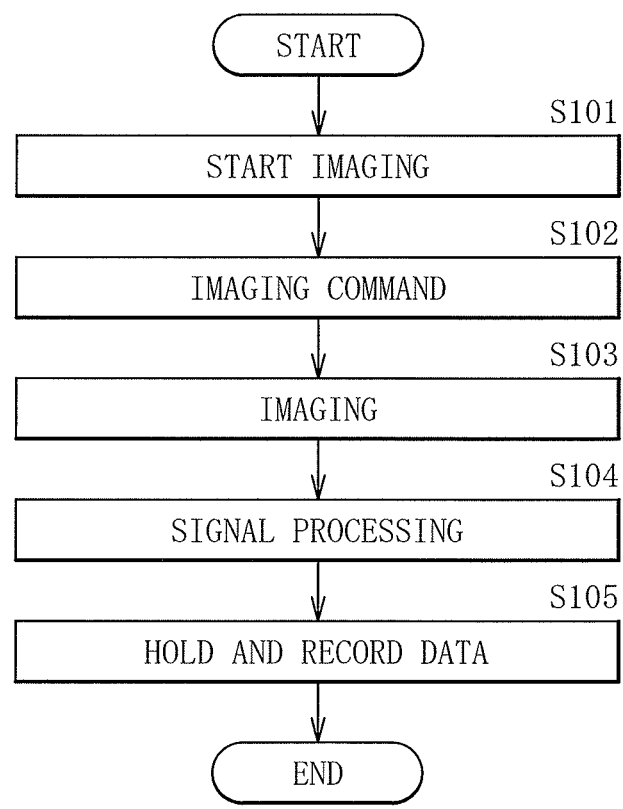

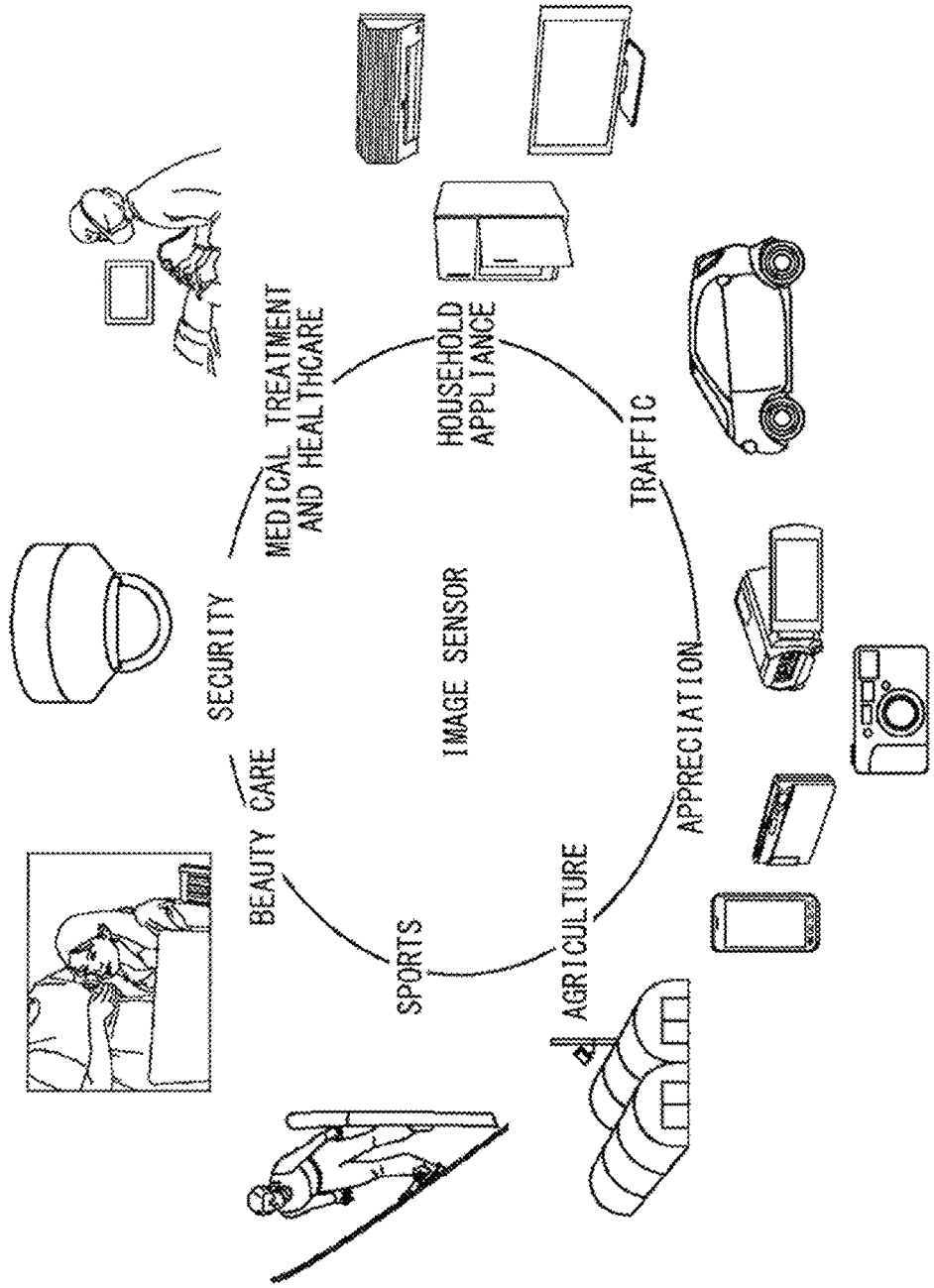
[Fig. 14]

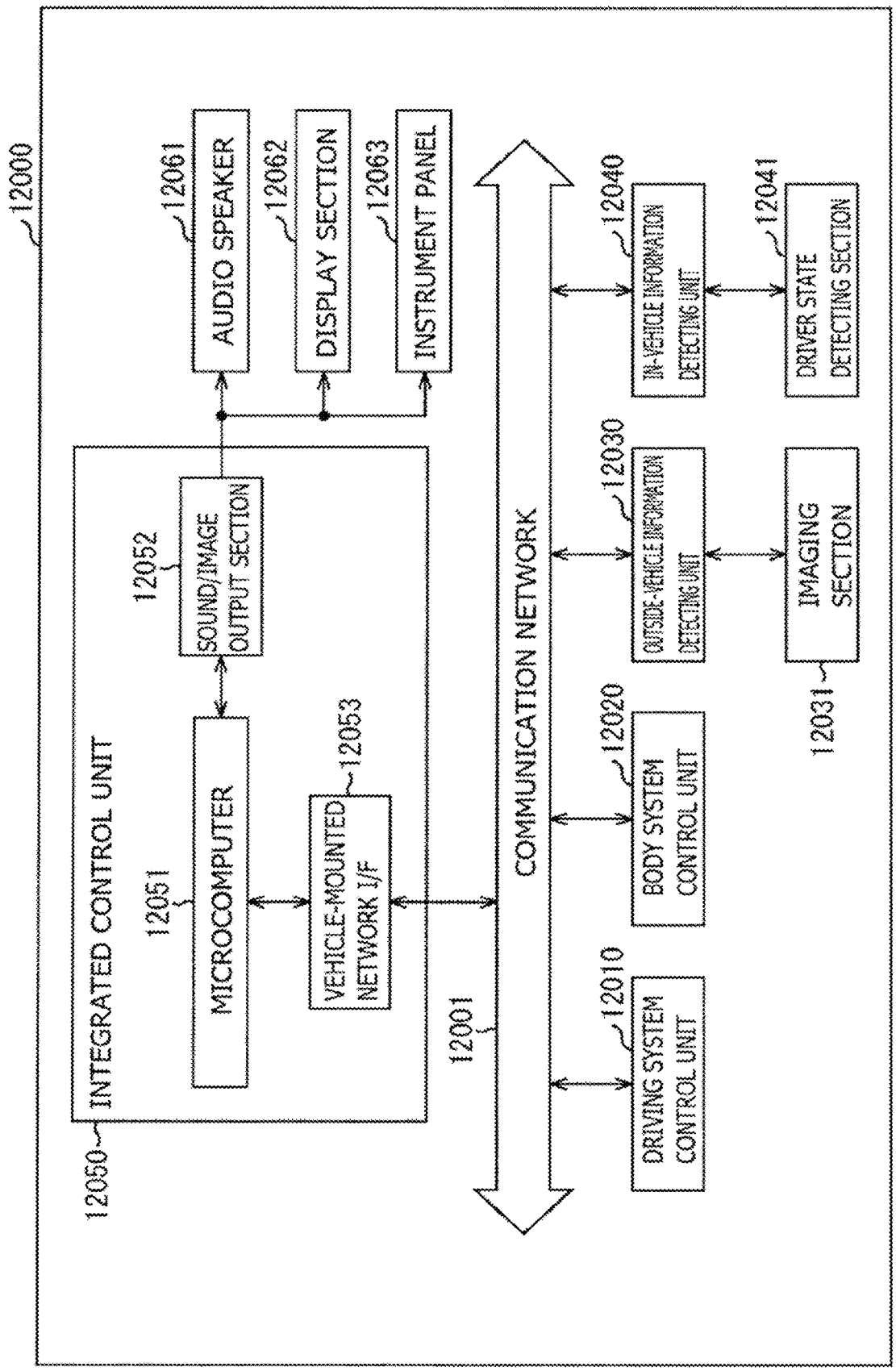
[Fig. 15]

[Fig. 16]
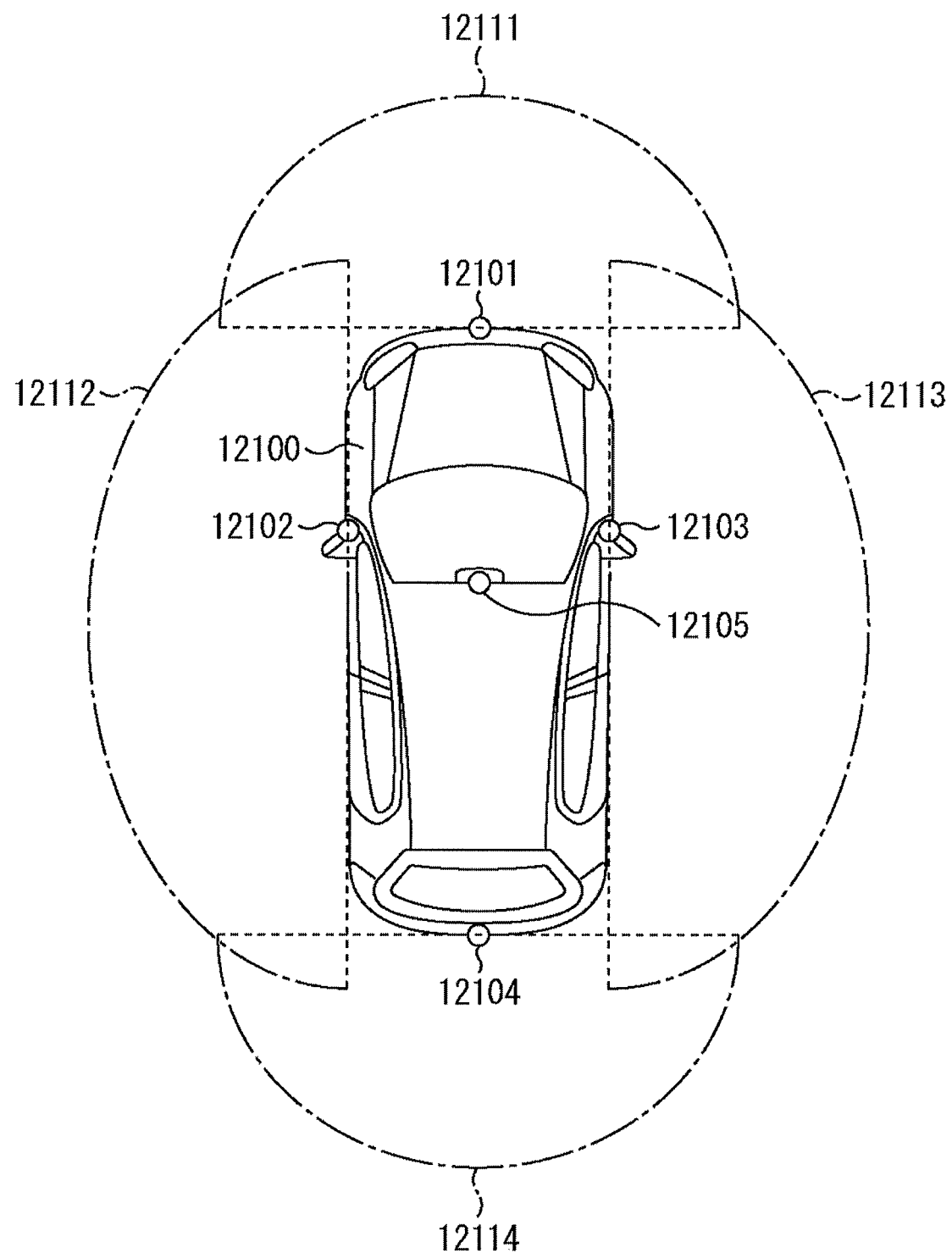

[Fig. 17]
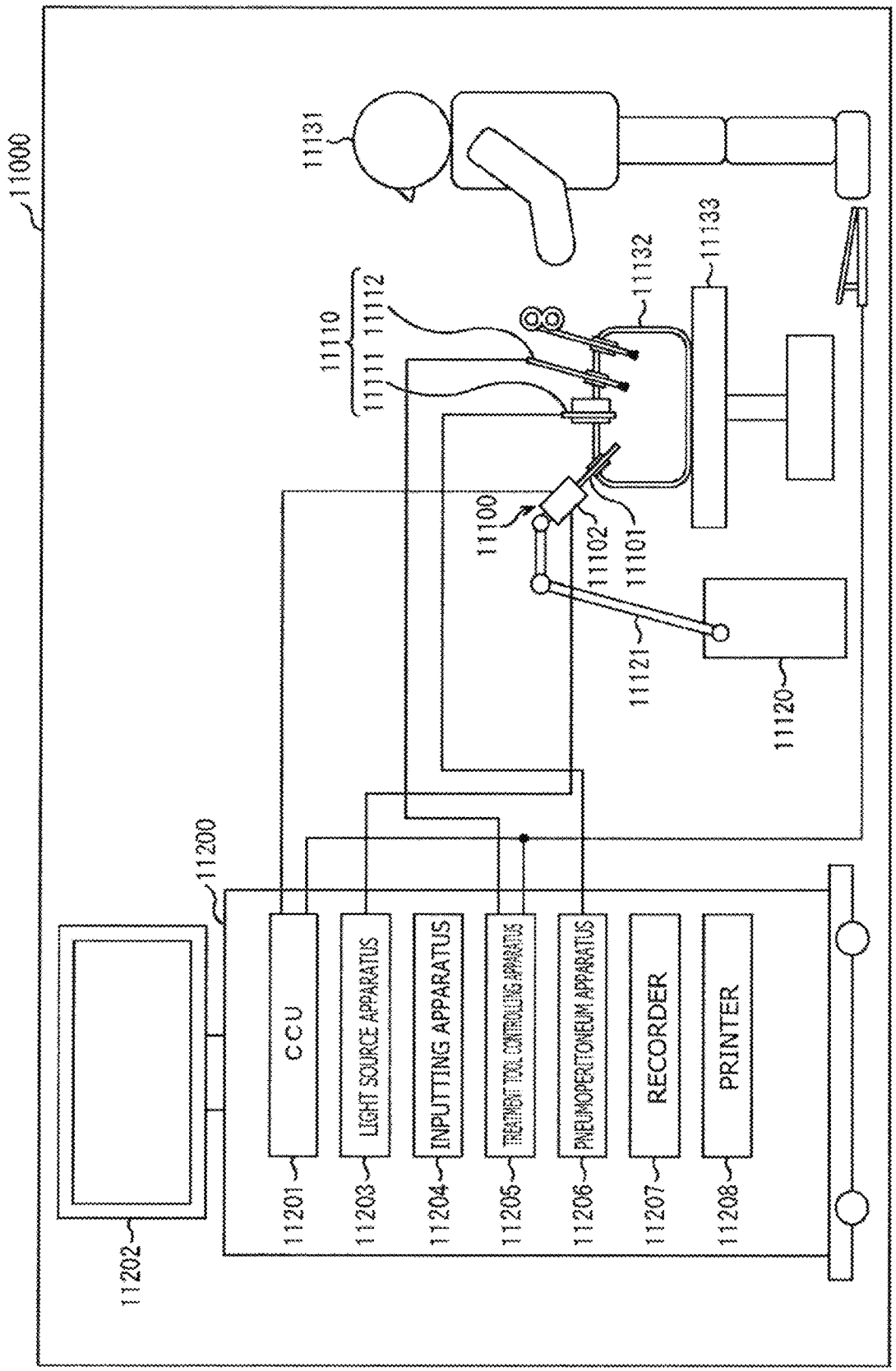

[Fig. 18]
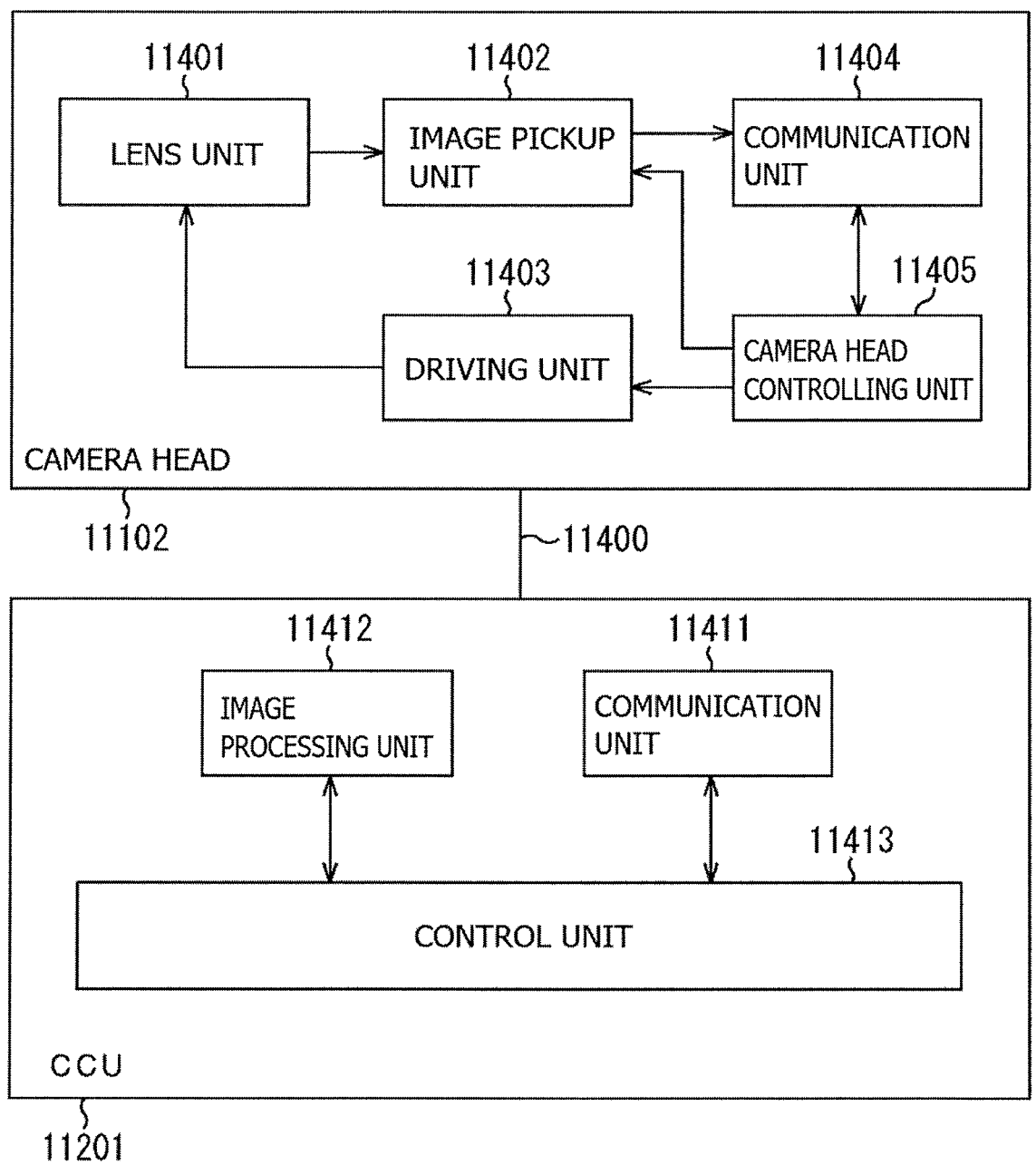

IMAGING DEVICE

CROSS REFERENCE TO RELATED APPLICATIONS

This application is a national stage application under 35 U.S.C. 371 and claims the benefit of PCT Application No. PCT/JP2020/017535, having an international filing date of 23 Apr. 2020, which designed the United States, which PCT application claimed the benefit of Japanese Priority Patent Application JP2019-160598, filed Sep. 3, 2019, the entire disclosure of each of which are incorporated herein by reference.

TECHNICAL FIELD

The present disclosure relates to an imaging device.

BACKGROUND ART

In recent years, regarding a CMOS (Complementary Metal-Oxide-Semiconductor) image sensor, it has been examined to achieve simultaneity of charge accumulation between pixels (i.e., to achieve a global shutter method) by providing an analog memory for each pixel.

Specifically, an entire pixel array simultaneously transfers charges from a photodiode to the analog memory, and the transferred charges are sequentially scanned and read from the analog memory. This makes it possible to cause timings of the charge accumulation in the entire pixel array to coincide (e.g., PTL 1).

CITATION LIST

Patent Literature

[PTL 1] Japanese Unexamined Patent Application Publication No. 2013-98446

SUMMARY

Technical Problem

Such a CMOS image sensor is required to sufficiently shield an analog memory from light in order to prevent generation of a new charge in the analog memory due to photoelectric conversion.

Furthermore, regarding the CMOS image sensor, it has been examined to provide a photodiode and the analog memory in a laminated manner in a thickness direction of a semiconductor substrate in order to maintain an area of the photodiode.

Therefore, a technology is desired that enhances an efficiency in charge transfer from the photodiode to the analog memory while maintaining light shielding properties for the analog memory.

Solution to Problem

An imaging device according to an embodiment of the present disclosure includes a photoelectric conversion section provided in a semiconductor substrate, a charge holding section that is provided as being laminated over the photoelectric conversion section in a thickness direction of the semiconductor substrate and holds a charge photoelectrically converted by the photoelectric conversion section, a horizontal light shielding film that is provided between the photoelectric conversion section and the charge holding section and extends in an in-plane direction of the semiconductor substrate, and a plurality of vertical gate electrodes that passes through an identical opening provided in the horizontal light shielding film and extends to the photoelectric conversion section in the thickness direction of the semiconductor substrate.

In the imaging device according to an embodiment of the present disclosure, the photoelectric conversion section and the charge holding section that holds the photoelectrically-converted charge are laminated and provided in the thickness direction of the semiconductor substrate with the horizontal light shielding film being interposed therebetween, and the plurality of vertical gate electrodes that extends to the photoelectric conversion section in the thickness direction of the semiconductor substrate passes through the identical opening provided in the horizontal light shielding film. This enables the imaging device according to an embodiment of the present disclosure, for example, to decrease an area occupied by the plurality of vertical gate electrodes and the opening, as compared with a case where the plurality of vertical gate electrodes that extend to the photoelectric conversion section in the thickness direction of the semiconductor substrate are formed through separate openings.

BRIEF DESCRIPTION OF DRAWINGS

FIG. 1 is a schematic diagram illustrating an overall configuration of an imaging device 1 according to a first embodiment of the present disclosure.

FIG. 2 is an equivalent circuit diagram of a pixel circuit included in a sensor pixel according to the first embodiment.

FIG. 3 is a plan view of arrangement of each component in a case where one principal surface of a semiconductor substrate 200, on which a sensor pixel 2 according to the first embodiment is provided, is viewed in a plan view.

FIG. 4 is a vertical cross-sectional view of a cross section obtained by cutting the sensor pixel 2 along a cutting line A-AA in FIG. 3.

FIG. 5 is an equivalent circuit diagram of a pixel circuit included in a sensor pixel according to a second embodiment of the present disclosure.

FIG. 6 is a plan view of arrangement of each component in a case where one principal surface of the semiconductor substrate 200, on which a sensor pixel 2A according to the second embodiment is provided, is viewed in a plan view.

FIG. 7 is a vertical cross-sectional view of a cross section obtained by cutting the sensor pixel 2A along a cutting line B-BB in FIG. 6.

FIG. 8A is a plan view of an example of arrangement of each component in a case where one principal surface of the semiconductor substrate 200, on which a sensor pixel according to a third embodiment of the present disclosure is provided, is viewed in a plan view.

FIG. 8B is a plan view of another example of the arrangement of each component in a case where one principal surface of the semiconductor substrate 200, on which the sensor pixel according to the third embodiment of the present disclosure is provided, is viewed in a plan view.

FIG. 9 is a plan view of an example of arrangement of each component in a case where one principal surface of the semiconductor substrate 200, on which a sensor pixel 2B according to a fourth embodiment of the present disclosure is provided, is viewed in a plan view.

FIG. 10 is a plan view of arrangement of each component in a case where one principal surface of the semiconductor substrate 200, on which a sensor pixel 2C according to a fifth embodiment of the present disclosure is provided, is viewed in a plan view.

FIG. 11 is a vertical cross-sectional view of a cross section obtained by cutting the sensor pixel 2C according to the fifth embodiment in a thickness direction of the semiconductor substrate 200.

FIG. 12 is a block diagram illustrating an example of a schematic configuration of an imaging system 900 including the imaging device 1 according to an embodiment of the present disclosure.

FIG. 13 illustrates an example of a flowchart of an imaging operation of the imaging system 900.

FIG. 14 is an explanatory diagram that describes a use example of the imaging system 900.

FIG. 15 is a block diagram depicting an example of schematic configuration of a vehicle control system.

FIG. 16 is a diagram of assistance in explaining an example of installation positions of an outside-vehicle information detecting section and an imaging section.

FIG. 17 is a view depicting an example of a schematic configuration of an endoscopic surgery system.

FIG. 18 is a block diagram depicting an example of a functional configuration of a camera head and a camera control unit (CCU).

DESCRIPTION OF EMBODIMENTS

Hereinafter, embodiments of the present disclosure are described in detail with reference to the drawings. The embodiments described below are merely specific examples of the present disclosure, and the technology according to the present disclosure is not limited to the following modes. Furthermore, arrangement, dimensions, a dimension ratio, and the like of the components illustrated in each drawing of the present disclosure are not limited to those illustrated in each drawing.

It is to be noted that the description is given in the following order.
1. First Embodiment
1.1. Overall Configuration of Imaging Device
1.2. Circuit Configuration
1.3. Pixel Configuration
2. Second Embodiment
2.1. Circuit Configuration
2.2. Pixel Configuration
3. Third Embodiment
4. Fourth Embodiment
5. Fifth Embodiment
6. Application Examples 1. First Embodiment (1.1. Overall Configuration of Imaging Device)

First, an overall configuration of an imaging device according to a first embodiment of the present disclosure is described with reference to FIG. 1. FIG. 1 is a schematic diagram illustrating an overall configuration of an imaging device 1 according to the present embodiment.

As illustrated in FIG. 1, the imaging device 1 includes a pixel array section 3, a vertical drive section 4, a ramp wave module 6, a clock module 7, a column processing section 8, a horizontal drive section 9, a system control section 10, and a signal processing section 5.

The imaging device 1 is, for example, a CMOS (Complementary Metal-Oxide-Semiconductor) type imaging device formed on a semiconductor substrate such as a silicon substrate.

More specifically, the imaging device 1 is a back-illuminated image sensor that achieves a global shutter method. The global shutter method typically represents an exposure method in which all pixels simultaneously start exposure and all the pixels simultaneously terminate the exposure. As used herein, all the pixels may represent all pixels that appear in a captured image except for a dummy pixel and the like. However, in a case where a time difference of the exposure or an image distortion is sufficiently small, the global shutter method may also include an exposure method in which simultaneous exposure in unit of a plurality of rows (e.g., several tens of rows) is performed in sequence instead of the simultaneous exposure of all the pixels. Furthermore, the global shutter method may also include an exposure method in which the exposure is simultaneously performed on each pixel in a predetermined region.

The pixel array section 3 is configured by arranging a plurality of sensor pixels (not illustrated) in matrix (matrix) on the semiconductor substrate such as a silicon substrate. In the pixel array section 3, pixel drive lines which extend in a row direction are wired for the respective sensor pixels arranged in a row direction, and vertical signal lines which extend in a column direction are wired for the respective sensor pixels arranged in a column direction.

Each of the plurality of sensor pixels includes, for example, a photoelectric conversion section such as a photodiode that converts incident light into a charge, a charge holding section that temporarily holds the charge photoelectrically converted by the photoelectric conversion section, and a pixel circuit that converts the charge read from the charge holding section into a pixel signal. The charge holding section is an electrically-conductive region provided in the semiconductor substrate and is provided as being laminated over the photoelectric conversion section in a thickness direction on the semiconductor substrate.

This enables each of the plurality of sensor pixels to temporarily hold the charge generated by the photoelectric conversion section in the charge holding section. Therefore, it is possible to separately control timings of start and end of the exposure and a timing of reading the generated charge. Therefore, in the imaging device 1, by temporarily holding the charge generated by the simultaneous exposure of all the pixels in the charge holding section of each sensor pixel and by converting the charge into the pixel signal, it is possible to sequentially read the pixel signal from each sensor pixel. Accordingly, providing the charge holding section for each sensor pixel makes it possible for the imaging device 1 to achieve the global shutter method.

The vertical drive section 4 includes, for example, a shift register, an address decoder, and the like. The vertical drive section 4 drives all the sensor pixels in the pixel array section 3 simultaneously or in unit of rows by supplying control signals to the respective sensor pixels via the plurality of pixel drive lines.

The ramp wave module 6 generates a ramp wave signal used to perform A/D (Analog/Digital) conversion on the pixel signal and supplies the generated ramp wave signal to the column processing section 8.

The column processing section 8 includes, for example, a shift register, an address decoder, and the like. The column processing section 8 converts the pixel signal into a digital signal by performing a noise removal process, a correlation double sampling process, an A/D conversion process, and the like on the pixel signal outputted from each sensor pixel for each column. The pixel signal that has been converted into the digital signal by the column processing section 8 is outputted to the signal processing section 5.

The clock module 7 generates a clock signal that controls driving of each section of the imaging device 1 on the basis of a master clock.

The horizontal drive section 9 includes, for example, a shift register, an address decoder, and the like. The horizontal drive section 9 sequentially selects respective unit circuits of the column processing section 8 corresponding to the columns of the sensor pixels to thereby sequentially output the pixel signal from the respective unit circuits of the column processing section 8 to the signal processing section 5.

The system control section 10 controls driving of each section of the imaging device 1. Specifically, the system control section 10 includes a timing generator that generates various timing signals and controls driving of the vertical drive section 4, the ramp wave module 6, the clock module 7, the column processing section 8, the horizontal drive section 9, and the like on the basis of the generated timing signals.

The signal processing section 5 generates an image signal representing a captured image by performing an arithmetic process and the like on the pixel signal outputted from the column processing section 8 and outputs the generated image signal to the outside of the imaging device 1. It is to be noted that the signal processing section 5 may perform the arithmetic process described above while temporarily storing data in an unillustrated data storage section, as necessary.

Peripheral circuits of the pixel array section 3 such as the vertical drive section 4, the ramp wave module 6, the clock module 7, the column processing section 8, the horizontal drive section 9, the system control section 10, the signal processing section 5, or the like may be formed on the semiconductor substrate on which the pixel array section 3 is formed. Alternatively, the peripheral circuits of the pixel array section 3 may be formed on a semiconductor layer that is further laminated on the semiconductor substrate on which the pixel array section 3 is formed, or may be formed on another semiconductor substrate adhered to the semiconductor substrate on which the pixel array section 3 is formed. Moreover, the peripheral circuits of the pixel array section 3 described above may be separately formed on the semiconductor substrate on which the pixel array section 3 is formed and on the semiconductor layer or the semiconductor substrate laminated on the semiconductor substrate.

(1.2. Circuit Configuration)

Subsequently, a circuit configuration of a sensor pixel according to the present embodiment is described with reference to FIG. 2. FIG. 2 is an equivalent circuit diagram of a pixel circuit included in the sensor pixel according to the present embodiment.

As illustrated in FIG. 2, the pixel circuit included in the sensor pixel includes, for example, a photoelectric conversion section (PD) 101, a first transfer transistor (TRZ) 111, a buffer section (Buffer) 103, a discharge transistor (OFG) 113, a second transfer transistor (TRX) 115, a charge holding section (MEM) 105, a third transfer transistor (TRG) 117, a floating diffusion section (FD) 107, a reset transistor (RST) 119, an amplification transistor (AMP) 121, and a selection transistor (SEL) 123.

The photoelectric conversion section 101 is, for example, a photodiode including a P-N junction. The photoelectric conversion section 101 generates a charge according to an amount of received light by photoelectrically converting light from a subject.

The first transfer transistor 111 is, for example, an N-type MOS-FET (Metal-Oxide-Semiconductor Field-Effect Transistor) provided between the photoelectric conversion section 101 and the buffer section 103. The first transfer transistor 111 transfers charge accumulated in the photoelectric conversion section 101 to the buffer section 103 in response to a drive signal applied to a gate electrode. Specifically, bringing the first transfer transistor 111 into an on-state (electrically-conductive state) causes the charge to be transferred from the photoelectric conversion section 101 to the buffer section 103.

The buffer section 103 functions as a midpoint when the charge accumulated in the photoelectric conversion section 101 is transferred to the charge holding section 105. For example, the buffer section 103 may temporarily hold the charge transferred from the photoelectric conversion section 101 until the charge is transferred to the charge holding section 105. Alternatively, the buffer section 103 may function as a transfer path used to transfer the charge transferred from the photoelectric conversion section 101 to the charge holding section 105.

The discharge transistor 113 is, for example, an N-type MOS-FET of which a drain is electrically coupled to a power supply VDD and a source is electrically coupled to the buffer section 103. The discharge transistor 113 initializes (resets) at least an electrical state of the buffer section 103 in response to the drive signal applied to the gate electrode.

Specifically, bringing the discharge transistor 113 into the on-state (electrically-conductive state) may cause the charge accumulated in the buffer section 103 to be discharged to the power supply VDD and a potential of the buffer section 103 to be reset to a potential of the power supply VDD. Furthermore, bringing the discharge transistor 113 into the on-state (electrically-conductive state) simultaneously with the first transfer transistor 111 may cause the charges accumulated in the buffer section 103 and the charge holding section 105 to be discharged to the power supply VDD and the potentials of the buffer section 103 and the charge holding section 105 to be reset to the potential of the power supply VDD.

Furthermore, forming an overflow path between the first transfer transistor 111 and the power supply VDD makes it possible for the discharge transistor 113 to discharge charges overflowed from the photoelectric conversion section 101 to the power supply VDD.

The second transfer transistor 115 is, for example, an N-type MOS-FET provided between the buffer section 103 and the charge holding section 105. The second transfer transistor 115 transfers the charge of the buffer section 103 to the charge holding section 105 in response to the drive signal applied to the gate electrode. Specifically, bringing the second transfer transistor 115 into the on-state (electrically-conductive state) causes the charge to be transferred from the buffer section 103 to the charge holding section 105.

For example, bringing the second transfer transistor 115 into the on-state (electrically-conductive state) may cause the charge that is temporarily held in the buffer section 103 to be transferred to the charge holding section 105. Alternatively, bringing the second transfer transistor 115 into the on-state (electrically-conductive state) simultaneously with the first transfer transistor 111 may cause the charge accumulated in the photoelectric conversion section 101 to be transferred to the charge holding section 105 via the buffer section 103.

The charge holding section 105 is a region that temporarily holds the charge accumulated in the photoelectric conversion section 101 to achieve the global shutter method.

The charge held by the charge holding section 105 is a charge generated by the simultaneous exposure of all the pixels, and is temporarily held by the charge holding section 105 until the pixel signal is sequentially read for each sensor pixel.

The third transfer transistor 117 is an N-type MOS-FET provided between the charge holding section 105 and the floating diffusion section 107. The third transfer transistor 117 transfers the charge held by the charge holding section 105 to the floating diffusion section 107 in response to the drive signal applied to the gate electrode. Specifically, bringing the third transfer transistor 117 into the on-state (electrically-conductive state) causes the charge to be transferred from the charge holding section 105 to the floating diffusion section 107.

The floating diffusion section 107 is used to convert the charge that is transferred from the charge holding section 105 via the third transfer transistor 117 into an electric signal (e.g., voltage signal). The floating diffusion section 107 is electrically coupled to a vertical signal line VSL via the amplification transistor 121, and is able to change a voltage applied to the gate electrode of the amplification transistor 121 depending on an amount of the accumulated charge. This enables the floating diffusion section 107 to control output of a source follower circuit including the amplification transistor 121 depending on the amount of the accumulated charge.

The amplification transistor 121 is an N-type MOS-FET of which a gate electrode is electrically coupled to the floating diffusion section 107, a drain is electrically coupled to the power supply VDD, and a source is electrically coupled to the vertical signal line VSL via the selection transistor 123. The amplification transistor 121 configures the source follower circuit to be able to read as a voltage signal the amount of the charge accumulated in the floating diffusion section 107.

The selection transistor 123 is an N-type MOS-FET provided between the source of the amplification transistor 121 and the vertical signal line VSL. A selection signal is supplied to a gate electrode of the selection transistor 123, thus bringing the selection transistor 123 into the on-state (electrically-conductive state), thereby causing a pixel into a selected state. In the pixel in the selected state, the voltage signal (i.e., the pixel signal) from the amplification transistor 121 according to the amount of the charge accumulated in the floating diffusion section 107 is read by the column processing section 8 via the vertical signal line VSL.

The reset transistor 119 is an N-type MOS-FET of which a drain is electrically coupled to the power supply VDD and a source is electrically coupled to the floating diffusion section 107. The reset transistor 119 initializes (reset) electrical states of components from the charge holding section 105 to the floating diffusion section 107 in response to the drive signal applied to the gate electrode. Specifically, in a case where the reset transistor 119 and the third transfer transistor 117 are brought into the on-state (electrically-conductive state), the charges accumulated in the charge holding section 105 and the floating diffusion section 107 are discharged to the power supply VDD, and the potentials of the charge holding section 105 and the floating diffusion section 107 are reset to the potential of the power supply VDD.

It is to be noted that the drive signals to the first transfer transistor 111, the second transfer transistor 115, the third transfer transistor 117, the discharge transistor 113, the reset transistor 119, and the selection transistor 123 are supplied from the vertical drive section 4 via a plurality of pixel drive lines (not illustrated) wired for each pixel row.

In the imaging device 1 according to the present embodiment, it is possible to achieve the global shutter method by providing each sensor pixel with the pixel circuit described above. However, the pixel circuit illustrated in FIG. 2 is merely an example, and the pixel circuit included in each sensor pixel of the imaging device 1 according to the present embodiment is not limited to the pixel circuit illustrated in FIG. 2. For example, the buffer section 103 and the second transfer transistor 115 may be omitted.

(1.3. Pixel Configuration)

Next, a planar configuration and a cross-sectional configuration of the sensor pixel according to the present embodiment are specifically described with reference to FIGS. 3 and 4. FIG. 3 is a plan view of arrangement of each component in a case where one principal surface of a semiconductor substrate 200, on which a sensor pixel 2 is provided, is viewed in a plan view. FIG. 4 is a vertical cross-sectional view of a cross section obtained by cutting the sensor pixel 2 along a cutting line A-AA in FIG. 3.

Hereinafter, the upper direction when facing FIG. 4 is referred to as upper side or front surface side, and the lower direction when facing FIG. 4 is referred to as lower side or back surface side. Therefore, FIG. 3 is a plan view of the semiconductor substrate 200 as viewed from the front surface side in a plan view.

As illustrated in FIGS. 3 and 4, in the sensor pixel 2, the photoelectric conversion section 101 is provided inside the semiconductor substrate 200 such as a silicon substrate, and an activation region 147 in which an electrically-conductive impurity is introduced is provided on the front surface side of the semiconductor substrate 200. The activation region 147 of the semiconductor substrate 200 includes each of the first transfer transistor 111, the buffer section 103, the discharge transistor 113, the second transfer transistor 115, the charge holding section 105, the third transfer transistor 117, the floating diffusion section 107, the amplification transistor 121, the selection transistor 123, and the reset transistor 119.

On the back surface side of the semiconductor substrate 200, although not illustrated, for example, a planarizing film, a color filter, and a microlens are further provided. On the front surface side of the semiconductor substrate 200, an interlayer insulating film 250 including silicon oxide ($SiO_x$), silicon nitride ($SiN_x$), silicon oxynitride (SiON), or the like is further provided to embed each transistor described above.

The photoelectric conversion section 101 includes an N-type region 211 and a P-type region 212 provided inside the semiconductor substrate 200 such as a silicon substrate. Light that has entered from the back surface side of the semiconductor substrate 200 is converted into a charge by a P-N junction of the N-type region 211 and the P-type region 212. The charge generated by the photoelectric conversion section 101 is accumulated in the N-type region 211.

Furthermore, a top surface and side surfaces of the photoelectric conversion section 101 are surrounded by a horizontal light shielding film 223 and a vertical light shielding film 221 in order to prevent incident light from entering an unintended region.

The vertical light shielding film 221 is provided in a wall-like shape extending in the thickness direction of the semiconductor substrate 200 to surround a portion or all the side surfaces of the photoelectric conversion section 101. It is possible for the vertical light shielding film 221 to prevent generation of a noise such as a mixed color between the sensor pixels 2 by preventing light from entering the photoelectric conversion section 101 from an oblique direction.

For example, the vertical light shielding film 221 may be provided as extending in the column direction across the plurality of sensor pixels between the columns of the sensor pixels adjacent to each other in the row direction of the pixel array section 3, or may be provided as extending in the row direction across the plurality of sensor pixels between the rows of the sensor pixels adjacent to each other in the column direction of the pixel array section 3. Alternatively, the vertical light shielding film 221 may be provided along the entire circumference of the sensor pixel 2 to allow the sensor pixels 2 to be separated from one another.

The horizontal light shielding film 223 is provided in a plate-like shape extending in an in-plane direction of the semiconductor substrate 200 to separate the photoelectric conversion section 101 from the first transfer transistor 111, the buffer section 103, the discharge transistor 113, the second transfer transistor 115, the charge holding section 105, the third transfer transistor 117, the floating diffusion section 107, the amplification transistor 121, the selection transistor 123, and the reset transistor 119.

Specifically, the horizontal light shielding film 223 is provided across the entire surface of the sensor pixel 2, except for an opening 135, on the top surface of the photoelectric conversion section 101. It is possible for the horizontal light shielding film 223 to prevent the light that has entered the photoelectric conversion section 101 from further entering the charge holding section 105 and the like that exist on deeper side of the semiconductor substrate 200.

Specifically, in the charge holding section 105 laminated over the photoelectric conversion section 101, there is a case where a P-N junction is formed at an interface with another region provided in the semiconductor substrate 200. Therefore, in a case where the light that has entered from the back surface side of the semiconductor substrate 200 reaches the charge holding section 105, the charge holding section 105 generates a charge, leading to a possibility that the charge may be a noise with respect to the pixel signal. The horizontal light shielding film 223 shields the light that has passed through the photoelectric conversion section 101, thereby making it possible to prevent the generation of the charge, which is to be the noise of the pixel signal, at the charge holding section 105.

The vertical light shielding film 221 and the horizontal light shielding film 223 may include, for example, a material containing metal, an alloy, metallic nitride, or a silicide having light shielding properties. For example, the vertical light shielding film 221 and the horizontal light shielding film 223 may include tungsten (W), titanium (Ti), tantalum (Ta), nickel (Ni), molybdenum (Mo), chromium (Cr), iridium (Ir), platiniridium (PtIr), titanium nitride (TiN), or tungsten silicide (WS), etc. However, the vertical light shielding film 221 and the horizontal light shielding film 223 may include a material other than those described above, as long as the material has the light shielding properties.

It is to be noted that a P+-type region 222 is provided around the vertical light shielding film 221 and the horizontal light shielding film 223. The P+-type region 222 is a region having P-type impurity concentration higher than that of the P-type region 212, and is provided to cover the vertical light shielding film 221 and the horizontal light shielding film 223. It is possible for the P+-type region 222 to prevent generation of a dark current caused by a defect that occurs at the interface between the vertical light shielding film 221 as well as the horizontal light shielding film 223 and the semiconductor substrate 200.

Furthermore, the horizontal light shielding film 223 is provided with the opening 135 to allow a vertical gate electrode 131 extending in the thickness direction of the semiconductor substrate 200 to be inserted into the N-type region 211.

The vertical gate electrode 131 is a gate electrode of the first transfer transistor 111, and is provided to transfer the charge accumulated in the N-type region 211 of the photoelectric conversion section 101 to the buffer section 103. Specifically, the first transfer transistor 111 is provided as a vertical transistor in which the N-type region 211 near one end of the vertical gate electrode 131 that passes through the opening 135 and extends in the thickness direction of the semiconductor substrate 200 is used as a source and the buffer section 103 near another end of the vertical gate electrode 131 on the front surface side of the semiconductor substrate 200 of the vertical gate electrode 131 is used as a drain. In the first transfer transistor 111, a channel is formed in the thickness direction of the semiconductor substrate 200 from the N-type region 211 which is the source to the buffer section 103 which is the drain. This enables the first transfer transistor 111 to extract the charge from the photoelectric conversion section 101 provided inside the semiconductor substrate 200 to the buffer section 103 existing on the front surface side of the semiconductor substrate 200.

Stopper layers 133 are provided on both sides of the opening 135 as sandwiching the opening 135. It is possible to form the stopper layer 133, for example, by silicon oxide ($SiO_x$), silicon nitride ($SiN_x$), silicon oxynitride (SiON), or the like. Forming the stopper layers 133 makes it possible to more easily form the opening 135 in the imaging device 1.

For example, it is possible to form the horizontal light shielding film 223 and the vertical light shielding film 221 by the following method. First, an opening used to form the vertical light shielding film 221 is formed in the thickness direction of the semiconductor substrate 200. Subsequently, an opening used to form the horizontal light shielding film 223 is formed by anisotropic etching in the in-plane direction of the semiconductor substrate 200 from the opening formed in the thickness direction of the semiconductor substrate 200. Thereafter, by filling the openings formed in the thickness direction and the in-plane direction of the semiconductor substrate 200 with a material having light shielding properties, it is possible to form the horizontal light shielding film 223 and the vertical light shielding film 221.

At this time, the stopper layer 133 functions as a stopping layer of the anisotropic etching performed in the in-plane direction of the semiconductor substrate 200. Therefore, the semiconductor substrate 200 in a region sandwiched by the stopper layers 133 which are formed in parallel to the vertical light shielding film 221 remains without being etching by the anisotropic etching performed in the in-plane direction of the semiconductor substrate 200. Therefore, it is possible to form, in the imaging device 1, the opening 135 of the horizontal light shielding film 223 in the region between the stopper layers 133 which are formed in parallel to the vertical light shielding film 221.

In the imaging device 1 according to the present embodiment, providing a plurality of vertical gate electrodes 131 in openings 135 makes it possible to enhance an efficiency in charge transfer from the photoelectric conversion section 101 to the charge holding section 105 while maintaining the light shielding properties with respect to the charge holding section 105.

For example, in a case where the vertical gate electrodes 131 are respectively formed in different openings 135, the horizontal light shielding film 223 that separates the openings 135 from each other is formed between the openings 135. On the other hand, in a case where the plurality of vertical gate electrodes 131 is formed in the same opening 135, it is possible to make the plurality of vertical gate electrodes 131 approach each other by omitting the horizontal light shielding film 223 that separates the openings 135 from each other. This enables the imaging device 1 according to the present embodiment to further enhance a charge transfer efficiency in the plurality of vertical gate electrodes 131 as a whole. Therefore, in the imaging device 1 according to the present embodiment, it is possible to enhance the charge transfer efficiency from the photoelectric conversion section 101 to the charge holding section 105 without enlarging an area of the opening 135.

Furthermore, according to the imaging device 1 of the present embodiment, it is possible to omit the horizontal light shielding film 223 that separates the openings 135 from each other. Therefore, it is possible to enhance an area efficiency of the sensor pixel 2. Moreover, according to the imaging device 1 of the present embodiment, it is possible to omit a manufacturing process for forming the horizontal light shielding film 223 that separates the openings 135 from each other. Therefore, it is possible to enhance an efficiency of the manufacturing process of the imaging device 1.

It is to be noted that, in FIGS. 3 and 4, an example has been illustrated in which the two vertical gate electrodes 131 are provided in the single opening 135. However, the present embodiment is not limited to such an example. For example, the number and the shape of the vertical gate electrodes 131 provided in the opening 135 are not particularly limited. Furthermore, when the plurality of vertical gate electrodes 131 is provided in at least one opening 135, the plurality of openings 135 may be provided in the sensor pixel 2.

The buffer section 103 is an N-type region provided near the vertical gate electrode 131 of the first transfer transistor 111. The charge is transferred from the N-type region 211 of the photoelectric conversion section 101 to the buffer section 103 via the channel of the first transfer transistor 111.

The second transfer transistor 115 is provided as a planar-type field-effect transistor. A gate electrode of the second transfer transistor 115 is provided on the semiconductor substrate 200 in a region corresponding to the charge holding section 105 with a gate insulating film 251 being interposed therebetween. The second transfer transistor 115 transfers the charge from the buffer section 103 to the charge holding section 105.

The charge holding section 105 is an N-type region provided in the semiconductor substrate 200 as being laminated over the photoelectric conversion section 101. Similarly to the buffer section 103, the charge holding section 105 is provided as a region having N-type impurity concentration higher than that of the N-type region 211 of the photoelectric conversion section 101. The charge is transferred from the buffer section 103 to the charge holding section 105 by the second transfer transistor 115.

Furthermore, a P+-type region 218 is further provided on the charge holding section 105 on the front surface side of the semiconductor substrate 200. The P+-type region 218 is a region having P-type impurity concentration higher than that of the P-type region 212. It is possible for the P+-type region 218 to prevent generation of a dark current caused by a defect that occurs at the interface between the semiconductor substrate 200 and the gate insulating film 251 laminated on the semiconductor substrate 200. That is, similarly to the P+-type region 222, it is possible for the P+-type region 218 to prevent the generation of the dark current caused by the defect that occurs at the interface between different materials.

The third transfer transistor 117 is provided as a vertical field-effect transistor. A gate electrode of the third transfer transistor 117 is provided to be extended in the thickness direction of the semiconductor substrate 200 and to be inserted into the charge holding section 105. The third transfer transistor 117 is provided to transfer the charge that is temporarily held by the charge holding section 105 to the floating diffusion section 107.

The third transfer transistor 117 is provided as a vertical transistor in which the charge holding section 105 around one end of the gate electrode that extends in the thickness direction of the semiconductor substrate 200 is used as a source, and the activation region 147 around another end of the gate electrode on the front surface side of the semiconductor substrate 200 is used as a drain. In the third transfer transistor 117, a channel is formed in the thickness direction of the semiconductor substrate 200 from the charge holding section 105 which is the source to the activation region 147 which is the drain. This enables the third transfer transistor 117 to transfer the charge that is temporarily held by the charge holding section 105 that is not exposed on the surface of the semiconductor substrate 200 to the floating diffusion section 107.

The first transfer transistor 111, the buffer section 103, the second transfer transistor 115, the charge holding section 105, and the third transfer transistor 117 may be provided as being sequentially arranged in one direction in a plane of the semiconductor substrate 200 along the activation region 147.

The floating diffusion section 107 is provided in an isopotential region from the activation region 147 near the charge holding section 105 to a position coupling to the gate electrode of the amplification transistor 121 via a low resistance region 219, a contact 141, and an unillustrated upper layer wiring line. The low resistance region 219 is a region that reduces a contact resistance between the contact 141 and the semiconductor substrate 200, and is provided, for example, as a silicide or a high-concentration N+-type region. The contact 141 is a through wiring line that electrically couples the activation region 147 and the unillustrated upper layer wiring line to each other, and is able to be formed by metal, an alloy, metal nitride, or the like.

The amplification transistor 121 is provided as a planar-type field-effect transistor on the front surface side of the semiconductor substrate 200. The floating diffusion section 107 is electrically coupled to the gate electrode of the amplification transistor 121 via the unillustrated upper layer wiring line. Furthermore, the drain of the amplification transistor 121 is electrically coupled to the power supply VDD via a contact 143 and the unillustrated upper layer wiring line. Moreover, the source of the amplification transistor 121 is electrically coupled to a drain of the selection transistor 123 via the activation region 147.

The selection transistor 123 is provided as a planar-type field-effect transistor on the front surface side of the semiconductor substrate 200. The drain of the selection transistor 123 is electrically coupled to the source of the amplification transistor 121 via the activation region 147. Furthermore, the source of the selection transistor 123 is electrically coupled to the vertical signal line VSL via a contact 145 and the unillustrated upper layer wiring line.

The reset transistor 119 is provided as a planar-type field-effect transistor on the front surface side of the semiconductor substrate 200. A drain of the reset transistor 119 is electrically coupled to the power supply VDD via the contact 143 and the unillustrated upper layer wiring line. Moreover, a source of the reset transistor 119 is electrically coupled to the floating diffusion section 107 via the activation region 147.

The discharge transistor 113 is provided as a planar-type field-effect transistor on the front surface side of the semiconductor substrate 200. A drain of the discharge transistor 113 is electrically coupled to the power supply VDD via a contact 139 and the unillustrated upper layer wiring line. Moreover, a source of the discharge transistor 113 is electrically coupled to the buffer section 103 via the activation region 147.

According to the sensor pixel 2 having such a configuration, by forming the plurality of vertical gate electrodes 131 in the opening 135 provided in the horizontal light shielding film 223, it is possible to efficiently enhance transmission characteristics from the photoelectric conversion section 101 to the charge holding section 105 with respect to the size of the opening 135. Furthermore, according to the sensor pixel 2, it is possible to suppress an increase in the area of the opening 135 caused by forming the plurality of vertical gate electrodes 131, thus making it possible to enhance a degree of freedom in a layout of the sensor pixel 2. Moreover, it is possible, in the sensor pixel 2, to form the horizontal light shielding film 223 including the opening 135 with a simpler structure, thus making it possible to lower difficulty in a process of forming the horizontal light shielding film 223.

2. Second Embodiment (2.1. Circuit Configuration)

Subsequently, a circuit configuration of a sensor pixel according to a second embodiment of the present disclosure is described with reference to FIG. 5. FIG. 5 is an equivalent circuit diagram of a pixel circuit included in the sensor pixel according to the present embodiment.

As illustrated in FIG. 5, the pixel circuit included in the sensor pixel includes, for example, the photoelectric conversion section (PD) 101, the first transfer transistor (TRZ) 111, the buffer section (Buffer) 103, the discharge transistor (OFG) 113, the second transfer transistor (TRX) 115, the charge holding section (MEM) 105, the third transfer transistor (TRG) 117, the floating diffusion section (FD) 107, the reset transistor (RST) 119, the amplification transistor (AMP) 121, and the selection transistor (SEL) 123.

The sensor pixel according to the second embodiment is different from the sensor pixel according to the first embodiment in that the discharge transistor 113 is electrically coupled to the photoelectric conversion section 101 instead of the buffer section 103. Components other than the discharge transistor 113 of the second embodiment are substantially the same as those of the first embodiment, and thus description here is omitted.

In the second embodiment, the discharge transistor 113 is, for example, an N-type MOS-FET of which a drain is electrically coupled to the power supply VDD and a source is electrically coupled to the photoelectric conversion section 101. The discharge transistor 113 is configured as a vertical transistor of which a gate electrode is inserted into the photoelectric conversion section 101 inside the semiconductor substrate 200, and initializes (resets) an electrical state of the photoelectric conversion section 101 in response to a drive signal applied to the gate electrode. Specifically, in a case where the discharge transistor 113 is brought into an on-state (electrically-conductive state), a charge accumulated in the photoelectric conversion section 101 is discharged to the power supply VDD, and a potential of the photoelectric conversion section 101 is reset to a potential of the power supply VDD. This enables the discharge transistor 113 to directly discharge the charge from the photoelectric conversion section 101 to the power supply VDD without using the first transfer transistor 111.

In the present embodiment, the plurality of vertical gate electrodes 131 formed in the opening 135 provided in the horizontal light shielding film 223 may be gate electrodes of different vertical transistors. This makes it possible to form the vertical gate electrode of the first transfer transistor 111 and the vertical gate electrode of the discharge transistor 113 in the same opening 135. Therefore, according to the imaging device of the present embodiment, it is possible to increase a capacity of discharging the charge from the photoelectric conversion section 101 by the discharge transistor 113 while suppressing enlargement of the opening 135.

(2.2. Pixel Configuration)

Next, a planar configuration and a cross-sectional configuration of the sensor pixel according to the present embodiment are specifically described with reference to FIGS. 6 and 7. FIG. 6 is a plan view of arrangement of each component in a case where one principal surface of the semiconductor substrate 200, on which a sensor pixel 2A is provided, is viewed in a plan view. FIG. 7 is a vertical cross-sectional view of a cross section obtained by cutting the sensor pixel 2A along a cutting line B-BB in FIG. 6.

As illustrated in FIGS. 6 and 7, in the sensor pixel 2A, the photoelectric conversion section 101 is provided inside the semiconductor substrate 200, and the activation region 147 in which an electrically-conductive impurity is introduced is provided on the front surface side of the semiconductor substrate 200. The activation region 147 of the semiconductor substrate 200 includes the first transfer transistor 111, the buffer section 103, the discharge transistor 113, the second transfer transistor 115, the charge holding section 105, the third transfer transistor 117, the floating diffusion section 107, the amplification transistor 121, the selection transistor 123, and the reset transistor 119.

The configuration and the formation position of the discharge transistor 113 of the sensor pixel 2A according to the second embodiment are different from those of the sensor pixel 2 according to the first embodiment. Specifically, the sensor pixel 2A is different from the sensor pixel 2 in that the discharge transistor 113 is provided as a vertical transistor that is electrically coupled to the photoelectric conversion section 101.

A vertical gate electrode 131Z is a gate electrode of the first transfer transistor 111, and is provided to transfer a charge accumulated in the N-type region 211 of the photoelectric conversion section 101 to the buffer section 103. Specifically, the vertical gate electrode 131Z is provided to extend in the thickness direction of the semiconductor substrate 200 through the opening 135 and to be inserted into the N-type region 211 of the photoelectric conversion section 101.

Meanwhile, a vertical gate electrode 131OF is a gate electrode of the discharge transistor 113, and is provided to discharge the charge accumulated in the N-type region 211 of the photoelectric conversion section 101 to the power supply VDD. Specifically, the vertical gate electrode 131OF is provided to extend in the thickness direction of the semiconductor substrate 200 through the opening 135 and to be inserted into the N-type region 211 of the photoelectric conversion section 101.

The discharge transistor 113 is provided as a vertical transistor of which a drain is electrically coupled to the power supply VDD and a source is electrically coupled to the photoelectric conversion section 101. Specifically, the discharge transistor 113 is provided as a vertical transistor in which the N-type region 211 near one end of the vertical gate electrode 131OF that passes through the opening 135 and extends in the thickness direction of the semiconductor substrate 200 is used as the source, and the low resistance region 219 near another end of the vertical gate electrode 131OF on the front surface side of the semiconductor substrate 200 is used as the drain. It is to be noted that the low resistance region 219 is a silicide or a high-concentration N+-type region, and is electrically coupled to the power supply VDD via the contact 139 and an unillustrated upper layer wiring line. This allows, in the discharge transistor 113, a channel to be formed in the thickness direction of the semiconductor substrate 200 from the N-type region 211 which is a source to the low resistance region 219 which is a drain.

As described in the present embodiment, a plurality of vertical gate electrodes 131Z and 131OF provided in the opening 135 may be the gate electrodes of respective different vertical transistors (i.e., the first transfer transistor 111 and the discharge transistor 113). This allows for formation of the vertical gate electrodes 131Z and 131OF in the identical opening 135 in the imaging device according to the present embodiment, thus making it possible to enhance transfer characteristics of the charge from the photoelectric conversion section 101 while suppressing enlargement of the opening 135.

3. Third Embodiment

Next, a sensor pixel according to a third embodiment of the present disclosure is described with reference to FIGS. 8A and 8B. FIG. 8A is a plan view of an example of arrangement of each component in a case where one principal surface of the semiconductor substrate 200, on which a sensor pixel according to the present embodiment is provided, is viewed in a plan view. FIG. 8B is a plan view of another example of the arrangement of each component in a case where one principal surface of the semiconductor substrate 200, on which the sensor pixel according to the present embodiment is provided, is viewed in a plan view.

The sensor pixel according to the third embodiment is different from the sensor pixel according to the first embodiment in that a vertical gate electrode of an adjacent sensor pixel is further formed in the opening 135.

As illustrated in FIG. 8A, for example, the horizontal light shielding film 223 may be continuously provided across two sensor pixels 2-1 and 2-2. At this time, the opening 135 of the horizontal light shielding film 223 may be continuously provided across the two sensor pixels 2-1 and 2-2, and the vertical gate electrode 131 of the first transfer transistor 111 of each of the two sensor pixels 2-1 and 2-2 may be provided through the opening 135.

Furthermore, as illustrated in FIG. 8B, for example, the horizontal light shielding film 223 may be continuously provided across four sensor pixels 2-1, 2-2, 2-3, and 2-4. At this time, the opening 135 of the horizontal light shielding film 223 may be continuously provided across the four sensor pixels 2-1, 2-2, 2-3, and 2-4, and the vertical gate electrode 131 of the first transfer transistor 111 of each of the four sensor pixels 2-1, 2-2, 2-3, and 2-4 may be provided through the opening 135.

As described in the present embodiment, the plurality of vertical gate electrodes 131 provided in the opening 135 may be gate electrodes of vertical transistors of different sensor pixels. This allows for formation of the vertical gate electrodes 131 of the different sensor pixels in the identical opening 135 in the imaging device according to the present embodiment, thus making it possible to enhance transfer characteristics of the charge from the photoelectric conversion section 101 while suppressing enlargement of the opening 135.

4. Fourth Embodiment

Subsequently, a sensor pixel according to a fourth embodiment of the present disclosure is described with reference to FIG. 9. FIG. 9 is a plan view of an example of arrangement of each component in a case where one principal surface of the semiconductor substrate 200, on which a sensor pixel 2B according to the present embodiment is provided, is viewed in a plan view.

The sensor pixel 2B according to the fourth embodiment is different from the sensor pixel 2 according to the first embodiment in that a plurality of transfer paths of a charge from the photoelectric conversion section 101 to a gate electrode of an amplification transistor 121 is provided.

As illustrated in FIG. 9, for example, a vertical gate electrode 131A of a first transfer transistor (TRZ1) 111A is inserted into the photoelectric conversion section 101. The charge accumulated in the photoelectric conversion section 101 is, for example, transferred to a first buffer section (not illustrated) by the first transfer transistor (TRZ1) 111A. The charge transferred to the first buffer section is transferred from the first buffer section to a first charge holding section (not illustrated) by a second transfer transistor (TRX1) 115A. Thereafter, the charge is temporarily held by the first charge holding section. The charge that is temporarily held by the first charge holding section is transferred to a first floating diffusion section (not illustrated) via a third transfer transistor (TRG1) 117A. The first floating diffusion section is electrically coupled to a gate electrode of the amplification transistor 121 via a contact 141A and an unillustrated upper layer wiring line, and is able to control output of the amplification transistor 121 depending on an amount of the charge accumulated in the first floating diffusion section.

Furthermore, a vertical gate electrode 131B of a first transfer transistor (TRZ2) 111B is inserted into the photoelectric conversion section 101. The charge accumulated in the photoelectric conversion section 101 is, for example, transferred to a second buffer section (not illustrated) by the first transfer transistor (TRZ2) 111B. The charge transferred to the second buffer section is transferred from the second buffer section to a second charge holding section (not illustrated) by a second transfer transistor (TRX2) 115B. Thereafter, the charge is temporarily held by the second charge holding section. The charge that is temporarily held by the second charge holding section is transferred to a second floating diffusion section (not illustrated) via a third transfer transistor (TRG2) 117B. The second floating diffusion section is electrically coupled to the gate electrode of the amplification transistor 121 via a contact 141B and an unillustrated upper layer wiring line, and is able to control output of the amplification transistor 121 depending on an amount of the charge accumulated in the second floating diffusion section.

Moreover, a vertical gate electrode 132 of the discharge transistor 113 is inserted into the photoelectric conversion section 101. That is, the discharge transistor 113 is provided as a vertical transistor that directly discharges the charge from the photoelectric conversion section 101. The vertical gate electrode 132 of the discharge transistor 113 may be provided in the opening 135 in which the vertical gate electrodes 131A and 131B of the first transfer transistors 111A and 111B are provided. This configuration makes it possible for the discharge transistor 113 to further enhance an area efficiency by suppressing enlargement of the opening 135.

In the sensor pixel 2B according to the fourth embodiment, a plurality of first transfer transistors 111, a plurality of buffer sections 103, a plurality of second transfer transistors 115, a plurality of charge holding sections 105, a plurality of third transfer transistors 117, and a plurality of floating diffusion sections 107 are provided, and a plurality of transfer paths of the charge from the photoelectric conversion section 101 to the gate electrode of the amplification transistor 121 is provided.

Such a configuration makes it possible to select which one of the plurality of charge holding sections 105 the charge accumulated in the photoelectric conversion section 101 is transferred to for each period of time. It is possible to use such a sensor pixel 2B, for example, as a ToF (Time of Flight) sensor.

The transfer paths of the charge from the photoelectric conversion section 101 to the gate electrode of the amplification transistor 121 may be symmetrically provided to allow delay time and the like to be identical. For example, in a case where there are two transfer paths of the charge from the photoelectric conversion section 101 to the gate electrode of the amplification transistor 121, the first transfer transistor 111, the buffer section 103, the second transfer transistor 115, the charge holding section 105, the third transfer transistor 117, and the floating diffusion section 107 forming each transfer path may be line-symmetrically arranged.

As described in the present embodiment, the vertical gate electrodes 131A and 131B of the first transfer transistors 111A and 111B configuring different transfer paths may be provided in the opening 135 of the horizontal light shielding film 223. This allows for formation of the vertical gate electrodes 131A and 131B configuring the different transfer paths in the identical opening 135 in the imaging device according to the present embodiment, thus making it possible to configure the sensor pixel 2B suitable for the ToF sensor while suppressing enlargement of the opening 135.

5. Fifth Embodiment

Next, a planar configuration and a cross-sectional configuration of a sensor pixel according to a fifth embodiment of the present disclosure are described with reference to FIGS. 10 and 11. FIG. 10 is a plan view of arrangement of each component in a case where one principal surface of the semiconductor substrate 200, on which a sensor pixel 2C is provided, is viewed in a plan view. FIG. 11 is a vertical cross-sectional view of a cross section obtained by cutting the sensor pixel 2C in a thickness direction of the semiconductor substrate 200.

As illustrated in FIGS. 10 and 11, in the sensor pixel 2C, the photoelectric conversion section 101 is provided inside the semiconductor substrate 200, and the activation region 147 in which an electrically-conductive impurity is introduced is provided on the front surface side of the semiconductor substrate 200. In the activation region 147 of the semiconductor substrate 200, the first transfer transistor 111, the buffer section 103, the discharge transistor 113, the second transfer transistor 115, the charge holding section 105, the third transfer transistor 117, and the floating diffusion section 107 are provided. Moreover, the interlayer insulating film 250 is laminated on the front surface side of the semiconductor substrate 200, and a circuit substrate 300 including the amplification transistor 121, the selection transistor 123, and the reset transistor 119 is adhered to the interlayer insulating film 250.

The sensor pixel 2C according to the fifth embodiment is different from the sensor pixel 2 according to the first embodiment in that the amplification transistor 121, the selection transistor 123, and the reset transistor 119 are provided in the circuit substrate 300 to be adhered to the semiconductor substrate 200.

Specifically, the circuit substrate 300 is configured by laminating a wiring line layer 350 on a substrate 310 such as a silicon substrate. On the substrate 310, the amplification transistor 121, the selection transistor 123, and the reset transistor 119 are provided, and on the wiring line layer 350, a wiring line 320 that electrically couples various electrodes of the amplification transistor 121, the selection transistor 123, and the reset transistor 119 to one another is provided. The wiring line layer 350 is configured by three-dimensionally arranging the wiring line 320 including various types of metal or alloys inside an insulating layer including silicon oxide ($SiO_x$), silicon nitride ($SiN_x$), or silicon oxynitride (SiON).

Furthermore, the circuit substrate 300 is adhered to the semiconductor substrate 200 to allow the wiring line layer 350 and the interlayer insulating film 250 to face each other. The wiring line 320 included in the wiring line layer 350 and a wiring line included in the interlayer insulating film 250 are electrically coupled by an electrode junction structure 321 obtained by joining respective electrodes exposed to an adhered surface between the wiring line layer 350 and the interlayer insulating film 250.

As described in the present embodiment, pixel circuits at the subsequent stage of the floating diffusion section 107 among the pixel circuits of the sensor pixel 2C may be provided on a substrate other than the semiconductor substrate 200. Specifically, the amplification transistor 121, the selection transistor 123, and the reset transistor 119 related to a signal process subsequent to the third transfer transistor 117 may be provided in the circuit substrate 300 adhered to the semiconductor substrate 200.

This makes it possible, in the sensor pixel 2C, to increase occupancy areas of the buffer section 103 and the charge holding section 105 in the semiconductor substrate 200. Therefore, it is possible to increase an amount of charges that are accumulable in the buffer section 103 and the charge holding section 105. Therefore, according to the fifth embodiment, it is possible to increase saturation electrons in the sensor pixel 2C.

6. Application Examples

Application examples of the imaging device according to an embodiment of the present disclosure are described with reference to FIGS. 12 to 18.

(Application to Imaging System)

First, an application example of an imaging device according to an embodiment of the present disclosure to an imaging system is described with reference to FIGS. 12 and 13. FIG. 12 is a block diagram illustrating an example of a schematic configuration of an imaging system 900 including the imaging device 1 according to an embodiment of the present disclosure. FIG. 13 illustrates an example of a flowchart of an imaging operation of the imaging system 900.

As illustrated in FIG. 12, the imaging system 900 is, for example, an electronic apparatus such as an imaging apparatus, e.g., a digital still camera, a video camera, or the like, or a mobile terminal apparatus, e.g., a smartphone, a tablet terminal, or the like.

The imaging system 900 includes, for example, a lens group 941, a shutter 942, the imaging device 1 according to each embodiment of the present disclosure, a DSP circuit 943, a frame memory 944, a display unit 945, a storage unit 946, an operation unit 947, and a power supply unit 948. In the imaging system 900, the imaging device 1, the DSP circuit 943, the frame memory 944, the display unit 945, the storage unit 946, the operation unit 947, and the power supply unit 948 are coupled to one another via a bus line 949.

The imaging device 1 outputs image data according to incident light that has passed through the lens group 941 and the shutter 942. The DSP circuit 943 is a signal processing circuit that processes a signal outputted from the imaging device 1 (i.e., the image data). The frame memory 944 temporarily holds the image data processed by the DSP circuit 943 in unit of frame. The display unit 945 is, for example, a panel-type display device such as a liquid crystal panel, an organic EL (Electro Luminescence) panel, or the like, and displays a moving image or a still image captured by the imaging device 1. The storage unit 946 includes a recording medium such as a semiconductor memory, a hard disk, or the like, and records the image data of the moving image or the still image captured by the imaging device 1. The operation unit 947 outputs an operation command regarding various functions of the imaging system 900 on the basis of an operation of a user. The power supply unit 948 is a various power supply that supplies operation power of the imaging device 1, the DSP circuit 943, the frame memory 944, the display unit 945, the storage unit 946, and the operation unit 947.

Next, an imaging procedure of the imaging system 900 is described.

As illustrated in FIG. 13, a user instructs to start imaging by operating the operation unit 947 (S101). In response to this instruction, the operation unit 947 transmits an imaging command to the imaging device 1 (S102). When receiving the imaging command, the imaging device 1 executes imaging in a predetermined imaging method (S103).

The imaging device 1 outputs the captured image data to the DSP circuit 943. As used herein, the image data is data for all pixels of a pixel signal that is generated on the basis of a charge that is temporarily held by the charge holding section 105 of each sensor pixel 2. The DSP circuit 943 performs a predetermined signal process (e.g., a noise reduction process and the like) on the image data outputted from the imaging device 1 (S104). The DSP circuit 943 causes frame memory 944 to hold the image data on which the predetermined signal process has been performed. Thereafter, the frame memory 944 causes the storage unit 946 to store the image data (S105). In this way, imaging by the imaging system 900 is performed.

In the present application example, the imaging device 1 according to an embodiment of the present disclosure is applied to the imaging system 900. According to the technology of the present disclosure, it is possible to enhance an efficiency in charge transfer from the photoelectric conversion section 101 to the charge holding section 105 while maintaining the light shielding properties with respect to the charge holding section 105. Therefore, according to the technology of the present disclosure, it is possible for the imaging system 900 that achieves the global shutter method to capture an image with higher image quality.

(Use Example of Imaging System)

Next, a use example of the imaging system 900 is described with reference to FIG. 14. FIG. 14 is an explanatory diagram that describes the use example of the imaging system 900.

As illustrated in FIG. 14, the imaging system 900 mounted with the imaging device 1 according to an embodiment of the present disclosure may be used in various situations in which light such as visible light, infrared light, ultraviolet light, X-rays, or the like is sensed.

For example, it is possible to use the imaging system 900 for an apparatus such as a digital camera that photographs an image used for appreciation or a mobile apparatus having a camera function.

For example, it is possible to use the imaging system 900 for an apparatus such as an onboard sensor that photographs front side, rear side, surroundings, or an inside of an automobile for safety drive such as automatic stop or recognition of driver's state, a monitoring camera that monitors a traveling vehicle or a road, or a distance measuring sensor that measures a distance between vehicles.

For example, it is possible to use the imaging system 900 for an apparatus that photographs a gesture of a user and operates appliances such as a television, a refrigerator, and an air conditioner in response to the photographed gesture.

For example, it is possible to use the imaging system 900 for an endoscope or an apparatus that images a blood vessel by receiving infrared light in the field of medical treatment or healthcare.

For example, it is possible to use the imaging system 900 for a security apparatus such as a monitoring camera for crime prevention, a camera for person authentication, or the like.

For example, it is possible to use the imaging system 900 for a skin measuring instrument that images skin, a microscope that images scalp, or the like in the field of beauty care.

For example, it is possible to use the imaging system 900 for an action camera, a wearable camera, or the like for sports use.

For example, it is possible to use the imaging system 900 for a camera that monitors states of fields, crops, or domestic animals, or the like in the fields of agriculture and animal husbandry.

(Application to Mobile Body Control System)

It is possible to apply the technology according to the present disclosure (the present technology) to various products. For example, the technology according to the present disclosure may be achieved as an apparatus to be mounted on a mobile body of any type, such as an automobile, an electric vehicle, a hybrid electric vehicle, a motorcycle, a bicycle, a personal mobility, an aircraft, a drone, a vessel, and a robot.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the mobile body control system to which the technology according to the present disclosure can be applied has been described above. The technology according to the present disclosure can be applied to the imaging section 12031 among the components described above. According to the technology of the present disclosure, it is possible to obtain a photographed image with higher image quality. Therefore, it is possible for the mobile body control system to perform control with high accuracy using the photographed image.

(Application to Endoscopic Surgery System)

FIG. 17 is a view depicting an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a pre-determined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 18 is a block diagram depicting an example of a functional configuration of the camera head 11102 and the CCU 11201 depicted in FIG. 17.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be preferably applied to the image pickup unit 11402 provided in the camera head 11102 of the endoscope 11100 among the components described above. According to the technology of the present disclosure, it is possible to further enhance the image quality of the image captured by the image pickup unit 11402. Therefore, it is possible to enhance visibility and operability of the user who uses the endoscopic surgery system.

The technology according to the present disclosure has been described above with reference to the first to fifth embodiments. However, the technology according to the present disclosure is not limited to the foregoing embodiments, etc., and may be modified in a wide variety of ways. For example, the foregoing first to the fifth embodiments may be combined with one another.

Furthermore, not all of the constituent elements and operations described in the embodiments are essential as constituent elements and operations of the present disclosure. For example, among the constituent elements of the embodiments, those that are not recited in any of the independent claims, which represent the broadest concepts of the present disclosure, are to be considered optional constituent elements.

The terms used throughout the present specification and the appended claims are to be construed as a "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items.

The terms used herein include a term that is simply used for convenience of description and does not limit a configuration and an operation. For example, the terms "right", "left", "upper", and "lower" only indicate directions in the drawing that is referred to. Furthermore, the terms "inward" and "outward" respectively indicate a direction toward the center of a focused element and a direction away from the center of the focused element. The same applies to terms similar thereto and terms having similar meanings.

It is to be noted that it is possible for the technology according to the present disclosure to have the following configurations. According to the technology of the present disclosure having the following configuration, by providing a plurality of vertical gate electrodes in the identical opening of a horizontal light shielding film provided between a photoelectric conversion section and a charge holding section, it is possible to suppress an increase in an area of the opening caused by increasing the number of vertical gate electrodes. Therefore, according to the technology of the present disclosure, it is possible to enhance a charge transfer efficiency from the photoelectric conversion section to the charge holding section while maintaining light shielding properties for the charge holding section that is an analog memory. Effects achieved by the technology according to the present disclosure are not necessarily limited to the effects described herein, and may be any of the effects described in the present disclosure.

(1)

An imaging device including:

a photoelectric conversion section provided in a semiconductor substrate;

a charge holding section that is provided as being laminated over the photoelectric conversion section in a thickness direction of the semiconductor substrate and holds a charge photoelectrically converted by the photoelectric conversion section;

a horizontal light shielding film that is provided between the photoelectric conversion section and the charge holding section and extends in an in-plane direction of the semiconductor substrate; and a plurality of vertical gate electrodes that passes through an identical opening provided in the horizontal light shielding film and extends to the photoelectric conversion section in the thickness direction of the semiconductor substrate.

(2)

The imaging device according to (1), further including a buffer section that temporarily holds the charge, in which the charge is transferred to the charge holding section from the photoelectric conversion section via the buffer section.

(3)

The imaging device according to (2), further including a discharge transistor that discharges the charge which is temporarily held by the buffer section to a power supply.

(4)

The imaging device according to any one of (1) to (3), further including a floating diffusion section that is electrically coupled to a gate electrode of an amplification transistor that converts the charge into an electric signal, in which the charge is transferred to the floating diffusion section from the charge holding section.

(5)

The imaging device according to (4), in which the amplification transistor is provided on a substrate adhered to the semiconductor substrate.

(6)

The imaging device according to any one of (1) to (5), in which the opening provided in the horizontal light shielding film is sandwiched by stopper layers in a direction orthogonal to an arrangement direction of the plurality of vertical gate electrodes and the charge holding section in a plane of the semiconductor substrate.

(7)

The imaging device according to any one of (1) to (6), in which the plurality of vertical gate electrodes includes the gate electrode of a transfer transistor that extracts the charge from the photoelectric conversion section to the charge holding section.

(8)

The imaging device according to any one of (1) to (6), further including a discharge transistor that discharges the charge accumulated in the photoelectric conversion section to a power supply, in which the plurality of vertical gate electrodes includes a gate electrode of the discharge transistor and a gate electrode of a transfer transistor that extracts the charge from the photoelectric conversion section to the charge holding section.

(9)

The imaging device according to any one of (1) to (6), in which the plurality of vertical gate electrodes includes gate electrodes of a plurality of transfer transistors that extracts the charge from each of a plurality of the photoelectric conversion sections included in a plurality of adjacent pixels.

(10)

The imaging device according to any one of (1) to (6), in which a plurality of the charge holding sections is provided, and the plurality of vertical gate electrodes includes gate electrodes of a plurality of transfer transistors that extracts the charge from the photoelectric conversion section to each of the plurality of charge holding sections.

(11)

The imaging device according to (10), in which the plurality of the charge holding sections are line-symmetrically arranged with respect to a straight line orthogonal to an arrangement direction of the respective gate electrodes of the plurality of transfer transistors in the plane of the semiconductor substrate.

(12)

The imaging device according to (11), further including a plurality of floating diffusion sections each electrically coupled to a gate electrode of a single amplification transistor that converts the charge into an electric signal, in which the charge is transferred to each of the plurality of floating diffusion sections from corresponding one of the plurality of the charge holding sections.

REFERENCE SIGNS LIST 1 imaging device
2, 2A, 2B, 2C sensor pixel
3 pixel array section
4 vertical drive section
5 signal processing section
6 ramp wave module
7 clock module
8 column processing section
9 horizontal drive section
10 system control section
101 photoelectric conversion section
103 buffer section
105 charge holding section
107 floating diffusion section
111, 111A, 111B first transfer transistor
113 discharge transistor
115, 115A, 115B second transfer transistor
117, 117A, 117B third transfer transistor
119 reset transistor
121 amplification transistor
123 selection transistor
131, 131OF, 131Z, 131A, 131B, 132 vertical gate electrode
133 stopper layer
135 opening
147 activation region
200 semiconductor substrate
211 N-type region
212 P-type region
218, 222 P+-type region
219 low resistance region
221 vertical light shielding film
223 horizontal light shielding film
250 interlayer insulating film
251 gate insulating film

What is claimed is:

1. An imaging device, comprising:
a photoelectric conversion section provided in a semiconductor substrate;
a charge holding section that is provided as being laminated over the photoelectric conversion section in a thickness direction of the semiconductor substrate and holds a charge photoelectrically converted by the photoelectric conversion section;
a horizontal light shielding film that is provided between the photoelectric conversion section and the charge holding section and extends in an in-plane direction of the semiconductor substrate; and
a plurality of vertical gate electrodes that passes through an identical opening provided in the horizontal light shielding film and extends to the photoelectric conversion section in the thickness direction of the semiconductor substrate.

2. The imaging device according to claim 1, further comprising a buffer section that temporarily holds the charge, wherein the charge is transferred to the charge holding section from the photoelectric conversion section via the buffer section.

3. The imaging device according to claim 2, further comprising a discharge transistor that discharges the charge which is temporarily held by the buffer section to a power supply.

4. The imaging device according to claim 1, further comprising a floating diffusion section that is electrically coupled to a gate electrode of an amplification transistor that converts the charge into an electric signal, wherein
the charge is transferred to the floating diffusion section from the charge holding section.

5. The imaging device according to claim 4, wherein the amplification transistor is provided on a substrate adhered to the semiconductor substrate.

6. The imaging device according to claim 1, wherein the opening provided in the horizontal light shielding film is sandwiched by stopper layers in a direction orthogonal to an arrangement direction of the plurality of vertical gate electrodes and the charge holding section in a plane of the semiconductor substrate.

7. The imaging device according to claim 1, wherein the plurality of vertical gate electrodes includes a gate electrode of a transfer transistor that extracts the charge from the photoelectric conversion section to the charge holding section.

8. The imaging device according to claim 1, further comprising a discharge transistor that discharges the charge accumulated in the photoelectric conversion section to a power supply, wherein
the plurality of vertical gate electrodes includes a gate electrode of the discharge transistor and a gate electrode of a transfer transistor that extracts the charge from the photoelectric conversion section to the charge holding section.

9. The imaging device according to claim 1, wherein the plurality of vertical gate electrodes includes gate electrodes of a plurality of transfer transistors that extracts the charge from each of a plurality of the photoelectric conversion sections included in a plurality of adjacent pixels.

10. The imaging device according to claim 1, wherein a plurality of the charge holding sections is provided, and the plurality of vertical gate electrodes includes gate electrodes of a plurality of transfer transistors that extracts the charge from the photoelectric conversion section to each of the plurality of the charge holding sections.

11. The imaging device according to claim 10, wherein the plurality of the charge holding sections are line-symmetrically arranged with respect to a straight line orthogonal to an arrangement direction of the respective gate electrodes of the plurality of transfer transistors in a plane of the semiconductor substrate.

12. The imaging device according to claim 10, further comprising a plurality of floating diffusion sections each electrically coupled to a gate electrode of a single amplification transistor that converts the charge into an electric signal, wherein
the charge is transferred to each of the plurality of floating diffusion sections from corresponding one of the plurality of the charge holding sections.

13. An electronic apparatus, comprising:
an optical system;
an imaging device that receives light from the optical system, the imaging device, comprising:
a photoelectric conversion section provided in a semiconductor substrate;
a charge holding section that is provided as being laminated over the photoelectric conversion section in a thickness direction of the semiconductor substrate and holds a charge photoelectrically converted by the photoelectric conversion section;
a horizontal light shielding film that is provided between the photoelectric conversion section and the charge holding section and extends in an in-plane direction of the semiconductor substrate; and
a plurality of vertical gate electrodes that passes through an identical opening provided in the horizontal light shielding film and extends to the photoelectric conversion section in the thickness direction of the semiconductor substrate; and
a processor that processes signals received from the imaging device.

14. The electronic apparatus according to claim 13, further comprising a buffer section that temporarily holds the charge, wherein
the charge is transferred to the charge holding section from the photoelectric conversion section via the buffer section.

15. The electronic apparatus according to claim 14, further comprising a discharge transistor that discharges the charge which is temporarily held by the buffer section to a power supply.

16. The electronic apparatus according to claim 13, further comprising a floating diffusion section that is electrically coupled to a gate electrode of an amplification transistor that converts the charge into an electric signal, wherein
the charge is transferred to the floating diffusion section from the charge holding section.

17. The electronic apparatus according to claim 16, wherein the amplification transistor is provided on a substrate adhered to the semiconductor substrate.

18. The electronic apparatus according to claim 13, wherein the opening provided in the horizontal light shielding film is sandwiched by stopper layers in a direction orthogonal to an arrangement direction of the plurality of vertical gate electrodes and the charge holding section in a plane of the semiconductor substrate.

19. The electronic apparatus according to claim 13, wherein the plurality of vertical gate electrodes includes a gate electrode of a transfer transistor that extracts the charge from the photoelectric conversion section to the charge holding section.

20. The electronic apparatus according to claim 13, further comprising a discharge transistor that discharges the charge accumulated in the photoelectric conversion section to a power supply, wherein
the plurality of vertical gate electrodes includes a gate electrode of the discharge transistor and a gate electrode of a transfer transistor that extracts the charge from the photoelectric conversion section to the charge holding section.

* * * * *